United States Patent
Lim et al.

(10) Patent No.: US 11,094,890 B2
(45) Date of Patent: Aug. 17, 2021

(54) ORGANIC TRANSISTOR

(71) Applicant: LG CHEM, LTD., Seoul (KR)

(72) Inventors: Bogyu Lim, Daejeon (KR);
Yong-Young Noh, Seoul (KR); Jiyoung Lee, Daejeon (KR); Seung-Hoon Lee, Seoul (KR)

(73) Assignee: LG CHEM, LTD.

( * ) Notice: Subject to any disclaimer, the term of this patent is extended or adjusted under 35 U.S.C. 154(b) by 13 days.

(21) Appl. No.: 16/486,163

(22) PCT Filed: Aug. 20, 2018

(86) PCT No.: PCT/KR2018/009524
§ 371 (c)(1),
(2) Date: Aug. 15, 2019

(87) PCT Pub. No.: WO2019/054655
PCT Pub. Date: Mar. 21, 2019

(65) Prior Publication Data
US 2019/0378993 A1    Dec. 12, 2019

(30) Foreign Application Priority Data

Sep. 18, 2017 (KR) .................. 10-2017-0119598

(51) Int. Cl.
*H01L 51/00* (2006.01)
*H01L 51/05* (2006.01)

(52) U.S. Cl.
CPC ...... *H01L 51/0069* (2013.01); *H01L 51/0071* (2013.01); *H01L 51/0558* (2013.01)

(58) Field of Classification Search
CPC ...... H01L 51/0074; C09D 5/24; C07D 285/14
See application file for complete search history.

(56) References Cited

U.S. PATENT DOCUMENTS

| | | | |
|---|---|---|---|
| 6,143,433 A | 11/2000 | Murata et al. | |
| 6,344,918 B1 | 2/2002 | Berneth et al. | |
| 7,445,855 B2 | 11/2008 | Mackenzie et al. | |
| 8,007,926 B2 | 8/2011 | Thompson et al. | |
| 9,190,626 B2 | 11/2015 | Joo et al. | |
| 9,391,281 B2 | 7/2016 | Lee et al. | |
| 9,540,374 B2 | 1/2017 | Park et al. | |
| 9,748,489 B2 | 8/2017 | Kim et al. | |

(Continued)

FOREIGN PATENT DOCUMENTS

| | | |
|---|---|---|
| CN | 104557968 | 4/2015 |
| JP | 2009155648 A | 7/2009 |

(Continued)

OTHER PUBLICATIONS

International Search Report corresponding to PCT/KR2018/009524 (dated Mar. 7, 2019; 5 pages with English translation).

(Continued)

*Primary Examiner* — Khanh T Nguyen
(74) *Attorney, Agent, or Firm* — Myers Bigel, P.A.

(57) ABSTRACT

The present specification relates to an organic transistor including: a source electrode; a drain electrode; a gate electrode; an insulating layer; and an organic semiconductor layer having one or more layers, in which one or more layers of the organic semiconductor layer include a compound represented by Formula 1.

8 Claims, 11 Drawing Sheets

(56) References Cited

U.S. PATENT DOCUMENTS

| | | | |
|---|---|---|---|
| 9,954,181 B2 | 4/2018 | Heo et al. | |
| 10,326,083 B2 | 6/2019 | Yagi et al. | |
| 10,381,569 B2 | 8/2019 | Xia et al. | |
| 10,662,313 B2 | 5/2020 | Choi et al. | |
| 10,756,276 B2 | 8/2020 | Lim et al. | |
| 2011/0049367 A1 | 3/2011 | Forrest et al. | |
| 2012/0119195 A1 | 5/2012 | Sagisaka et al. | |
| 2013/0042918 A1 | 2/2013 | Evans et al. | |
| 2013/0105768 A1 | 5/2013 | Leem et al. | |
| 2014/0131627 A1 | 5/2014 | Wang et al. | |
| 2014/0158949 A1 | 6/2014 | Wang et al. | |
| 2014/0252279 A1 | 9/2014 | Wang et al. | |
| 2015/0041727 A1 | 2/2015 | Wang et al. | |
| 2016/0372680 A1* | 12/2016 | Lim | H01L 51/0074 |
| 2017/0018724 A1 | 1/2017 | Tsuyama et al. | |
| 2017/0210752 A1 | 7/2017 | Mitchell et al. | |
| 2019/0363262 A1 | 11/2019 | Lim et al. | |
| 2020/0301230 A1 | 9/2020 | Lim et al. | |

FOREIGN PATENT DOCUMENTS

| | | | | |
|---|---|---|---|---|
| JP | 2015-059109 A | * | 3/2015 | C07C 13/547 |
| JP | 2016065218 A | | 4/2016 | |
| KR | 1020010112380 | | 12/2001 | |
| KR | 20080075663 | | 8/2008 | |
| KR | 1020110132858 | | 12/2011 | |
| KR | 1020120043009 A | | 5/2012 | |
| KR | 1020130047367 A | | 5/2013 | |
| KR | 20140063579 | | 5/2014 | |
| KR | 20140063608 | | 5/2014 | |
| KR | 20140088571 | | 7/2014 | |
| KR | 1020140135749 A | | 11/2014 | |
| KR | 2015-0113631 A | * | 10/2015 | C07D 285/14 |
| KR | 2015-0121661 A | * | 10/2015 | C07D 417/14 |
| KR | 20150113631 | | 10/2015 | |
| KR | 1020150113629 A | | 10/2015 | |
| KR | 20160097766 | | 8/2016 | |
| KR | 20170003234 | | 1/2017 | |
| KR | 1020170038037 A | | 4/2017 | |
| WO | 2019066553 A2 | | 4/2019 | |

OTHER PUBLICATIONS

Lee et al. "Highly p-extended small molecules with bis(alkylthio)methylene side chains for organic field-effect transistors" Journal of Materials Chemistry C, 6: 7604-7611 (2018).

Chemical Abstract Service STN Database, Registry No. 1817646-68-6 [Entered STN: Oct. 30, 2015]. (Year: 2015).

"C.W. Tang, Two-layer organic photovoltaic cell, Appl. Phys. Lett., vol. 48, No. 2, 1986, pp. 183-185".

"International Search Report corresponding to PCT/KR2018/007567; dated Oct. 16, 2018 (5 pages with English translation)".

"International Search Report corresponding to PCT/KR2018/003091; dated Jun. 22, 2018 (6 pages with English translation)".

"International Search Report corresponding to PCT/KR2018/010895; dated Jan. 2, 2019 (5 pages with English translation)".

Lin, et al., "A Facile Planar Fused-Ring Electron Acceptor for As-Cast Polymer Solar Cells with 8.71% Efficiency, Journal of the American Chemical Society, 2016, 138 (9), 2973-2976".

Yu, et al., "Polymer Photovoltaic Cells: Enhanced Efficiencies via a Network of Internal Donor-Acceptor Heterojunctions, Science, vol. 270, 1995, pp. 1789-1791".

Zhao, et al., ""Derivatives of 4,9-Dihydro-s-indaceno[1,2-b:5,6-b']dithiophene-4,9-dione: Synthesis and Properties" J. Org. Chem., 72(17):6364-6371 (2007)".

* cited by examiner

ORGANIC TRANSISTOR

CROSS REFERENCE TO RELATED APPLICATIONS

This application is a 35 U.S.C. § 371 national stage application of PCT International Application No. PCT/KR2018/009524, filed Aug. 20, 2018, which claims priority from Korean Patent Application No. 10-2017-0119598, filed Sep. 18, 2017, the contents of which are incorporated herein in their entireties by reference. The above-referenced PCT International Application was published in the Korean language as International Publication No. WO 2019/054655 on Mar. 21, 2019.

TECHNICAL FIELD

The present specification relates to an organic transistor.

TECHNICAL FIELD

This application claims priority to and the benefit of Korean Patent Application No. 10-2017-0119598 filed in the Korean Intellectual Property Office on Sep. 18, 2017, the entire contents of which are incorporated herein by reference.

The present specification relates to an organic transistor.

BACKGROUND ART

A field-effect transistor (FET) in the form of a thin film is composed of a source electrode, a drain electrode, a gate electrode, an insulating layer, and a semiconductor layer, and recently, interests in an organic transistor in which an organic material such as a single molecule, a polymer, and an oligomer is applied to a semiconductor layer have been increased.

Among the organic materials, a single molecule for a solution process can be applied to a flexible substrate, subjected to a low temperature process, and applied to a large area, thereby improving processability and economic feasibility. Further, the single molecule for a solution process has no batch-to-batch difference as compared to a polymer, and thus is advantageous in commercialization when applied to a semiconductor layer.

Meanwhile, the structure of the organic transistor may have a top gate or bottom gate structure depending on the position of a gate electrode, and the bottom gate structure may be divided into a top contact or bottom contact structure depending on whether the source/drain electrode is disposed on or below the semiconductor layer.

The top gate structure may be advantageous in performance because an area in which the semiconductor layer is brought into contact with the source electrode and the drain electrode is relatively large, and the top gate structure may be advantageous in air stability because a top electrode is applied onto the semiconductor layer.

The performance of an organic transistor may be evaluated in terms of charge mobility, on/off ratio, and the like, and a high-performance organic semiconductor needs to be developed in order to improve the performance of the organic transistor.

DETAILED DESCRIPTION OF THE INVENTION

Technical Problem

The present specification provides an organic transistor.

Technical Solution

An exemplary embodiment of the present specification provides an organic transistor including: a source electrode; a drain electrode; a gate electrode; an insulating layer; and an organic semiconductor layer having one or more layers, in which one or more layers of the organic semiconductor layer include a compound represented by the following Formula 1.

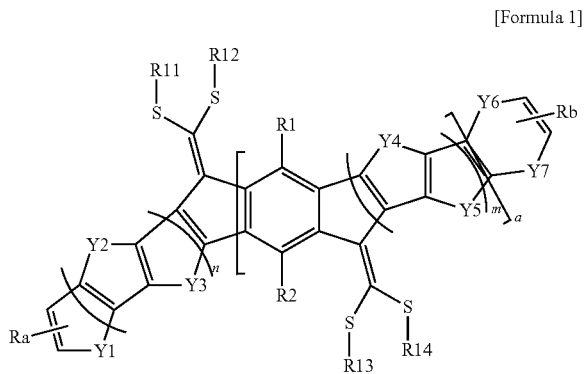

[Formula 1]

In Formula 1,

Ra and Rb are the same as or different from each other, and are each independently a group which serves as an electron acceptor, Y1 to Y5 are the same as or different from each other, and are each independently CRR', NR, O, SiRR', PR, S, GeRR', Se, or Te, Y6 and Y7 are different from each other, and are each independently a direct bond, CRR', NR, O, SiRR', PR, S, GeRR', Se, or Te, a is 0 or 1, when a is 0, Y6 is a direct bond, and Y7 is CRR', NR, O, SiRR', PR, S, GeRR', Se, or Te, when a is 1, Y7 is a direct bond, and Y6 is CRR', NR, O, SiRR', PR, S, GeRR', Se, or Te, n and m are each an integer from 0 to 5, when n and m are each 2 or more, the structures in the parenthesis are the same as or different from each other, and R1, R2, R11 to R14, R, and R' are the same as or different from each other, and are each independently hydrogen; deuterium; a substituted or unsubstituted alkyl group; a substituted or unsubstituted cycloalkyl group; a substituted or unsubstituted aryl group; or a substituted or unsubstituted heterocyclic group.

Advantageous Effects

An organic transistor according to an exemplary embodiment of the present specification exhibits high charge mobility and performance because a compound having improved crystallinity due to the intramolecular chalcogen-chalcogen interaction caused by introducing sulfur (S) into an alkyl chain is applied to an organic semiconductor layer.

The organic transistor according to an exemplary embodiment of the present specification exhibits an ambipolar property.

Figure 1:
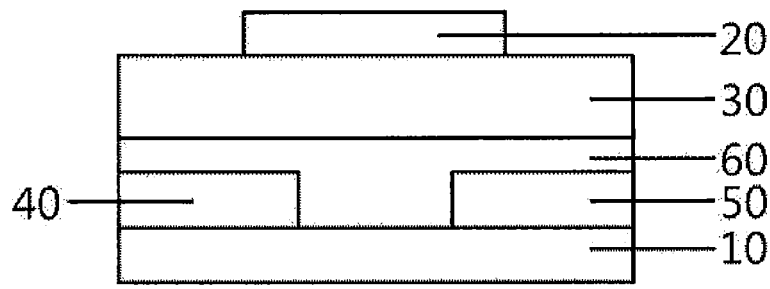
FIGS. 1 to 4 are views illustrating an organic transistor according to an exemplary embodiment of the present invention.

10: Substrate
20: Gate electrode
30: Insulating layer
40: Source electrode
50: Drain electrode
60: Organic semiconductor layer

BEST MODE

Hereinafter, the present specification will be described in detail.

The present specification provides an organic transistor including an organic semiconductor layer including the compound represented by Formula 1. More specifically, the present specification provides an organic transistor including: a source electrode; a drain electrode; a gate electrode; an insulating layer, and an organic semiconductor layer having one or more layers, in which one or more layers of the organic semiconductor layer include the compound represented by Formula 1.

The compound exhibits high charge mobility when applied to a device because sulfur is introduced into an alkyl chain and thus the crystallinity thereof is improved due to the intramolecular chalcogen-chalcogen interaction, and accordingly, the compound exhibits an effect in which the performance of a device is improved.

Further, the compound exhibits strong electron-withdrawing characteristics, and thus may exhibit an ambipolar property when applied to a device.

In general, in the case of an inverter, two organic transistors in which electrons and holes each flow need to be joined with each other in order to constitute a circuit. Accordingly, two organic transistors each coated with materials exhibiting N-type characteristics and P-type characteristics need to be provided in order to realize an inverter. In contrast, according to an exemplary embodiment of the present specification, since the compound has an ambipolar property exhibiting both N-type characteristics and P-type characteristics, an inverter can be realized by using only one material. That is, the organic transistor according to an exemplary embodiment of the present specification can realize an inverter by including the compound in the organic semiconductor layer. Accordingly, only one material needs to be coated in order to realize an inverter, so that the process is simple as compared to a general manufacturing method of an inverter.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

In the present specification, + means a site bonded to another substituent, a monomer, or a binding portion.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a nitrile group; a nitro group; an imide group; an amide group; a carbonyl group; an ester group; a hydroxyl group; an alkyl group; a cycloalkyl group; an alkoxy group; an aryloxy group; an alkylthioxy group; an arylthioxy group; an alkylsulfoxy group; an arylsulfoxy group; an alkenyl group; a silyl group; a siloxane group; a boron group; an amine group; an arylphosphine group; a phosphine oxide group; an aryl group; and a heterocyclic group, or being substituted with a substituent to which two or more substituents among the exemplified substituents are linked, or having no substituent. For example, "the substituent to which two or more substituents are linked" may be a biphenyl group. That is, the biphenyl group may also be an aryl group, and may be interpreted as a substituent to which two phenyl groups are linked.

In the present specification, a halogen group may be fluorine, chlorine, bromine or iodine.

In the present specification, the alkyl group may be straight-chained or branched, and the number of carbon atoms thereof is not particularly limited, but is preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 2-ethylhexyl, 2-ethylbutyl, 1-methylpentyl, 2-methylpentyl, 4-methyl-2-pentyl, 3,3-dimethylbutyl, heptyl, n-heptyl, 1-methylhexyl, octyl, n-octyl, tert-octyl, 1-methylheptyl, 2-propylpentyl, n-nonyl, 2,2-dimethylheptyl, 1-ethyl-propyl, 1,1-dimethyl-propyl, isohexyl, 4-methylhexyl, 5-methylhexyl, 2,6-dimethyloctane, and the like, but are not limited thereto.

In the present specification, a cycloalkyl group is not particularly limited, but has preferably 3 to 30 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, an aryl group may be monocyclic or polycyclic.

When the aryl group is a monocyclic aryl group, the number of carbon atoms thereof is not particularly limited, but is preferably 6 to 30. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 30. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

In the present specification, a heterocyclic group includes one or more atoms other than carbon, that is, one or more heteroatoms, and specifically, the heteroatom may include one or more atoms selected from the group consisting of O, N, Se, S, and the like. The number of carbon atoms thereof is not particularly limited, but is preferably 2 to 30, and the heterocyclic group may be monocyclic or polycyclic. Examples of the heterocyclic group include a thiophene group, an imidazolyl group, a thiazolyl group, a pyridyl group, a bipyridyl group, a pyrimidyl group, a triazinyl group, a triazolyl group, an acridyl group, a pyridazinyl group, a pyrazinyl group, a qinolinyl group, a quinazolinyl group, a quinoxalinyl group, a phthalazinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group (phenanthroline), a thiazolyl group, an isoxazolyl group, an oxadiazolyl group, a thiadiazolyl group, a phenothiazinyl group, a dibenzofuranyl group, and the like, but are not limited thereto.

In an exemplary embodiment of the present specification, Formula 1 may be represented by the following Formula 2 or 3.

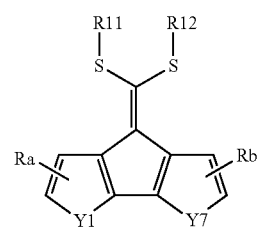

[Formula 2]

[Formula 3]

In Formula 2 or 3,

Y6 and Y7 are the same as or different from each other, and are each independently CRR', NR, O, SiRR', PR, S, GeRR', Se, or Te, and Ra, Rb, Y1 to Y5, R1, R2, R11 to R14, R, and R' are the same as those defined in Formula 1.

In an exemplary embodiment of the present specification, Formula 3 may be represented by the following Formula 1-1 or 1-2.

[Formula 1-1]

[Formula 1-2]

In Formula 1-1 or 1-2,

Y6 is CRR', NR, O, SiRR', PR, S, GeRR', Se, or Te, and

Ra, Rb, Y1 to Y5, R1, R2, R11 to R14, R, and R' are the same as those defined in Formula 1.

In an exemplary embodiment of the present specification, R1 and R2 are hydrogen.

In an exemplary embodiment of the present specification, Ra and Rb are the same as or different from each other, and are each any one of the following structures.

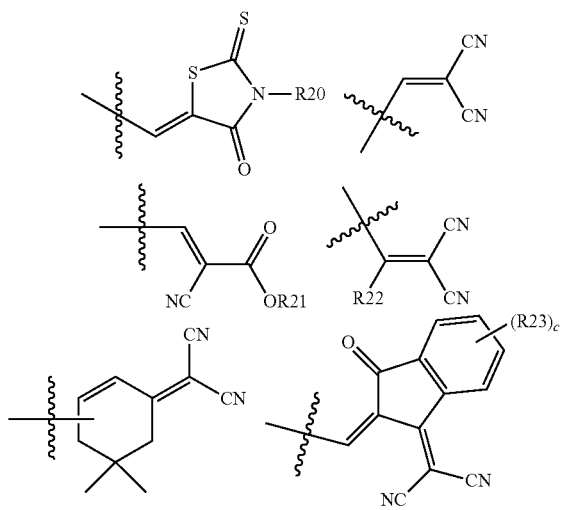

In the structures, c is an integer from 1 to 4, when c is 2 or more, two or more structures in the parenthesis are the same as or different from each other, and R20 to R23 are the same as or different from each other, and are each independently hydrogen; deuterium; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, R20 to R23 are the same as or different from each other, and are each independently hydrogen; deuterium; a halogen group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, R20 to R23 are the same as or different from each other, and are each independently hydrogen; or a substituted or unsubstituted alkyl group.

In an exemplary embodiment of the present specification, R20 is a substituted or unsubstituted alkyl group.

In an exemplary embodiment of the present specification, R20 is a substituted or unsubstituted alkyl group having 1 to 30 carbon atoms.

In an exemplary embodiment of the present specification, R20 is a substituted or unsubstituted alkyl group having 1 to 20 carbon atoms.

In an exemplary embodiment of the present specification, R20 is a substituted or unsubstituted alkyl group having 1 to 10 carbon atoms.

In an exemplary embodiment of the present specification, R20 is an alkyl group having 1 to 10 carbon atoms.

In an exemplary embodiment of the present specification, R21 to R23 are each hydrogen.

In an exemplary embodiment of the present specification, Ra and Rb are each

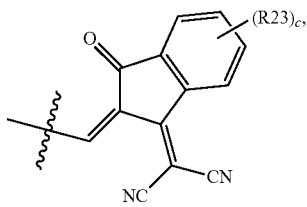

and R23 and c are the same as those described above.

In an exemplary embodiment of the present specification, Ra and Rb are each

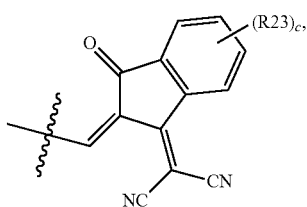

and R23 is hydrogen.

In an exemplary embodiment of the present specification, Ra and Rb are each

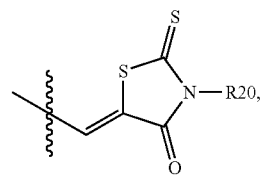

and R20 is the same as that described above.

In an exemplary embodiment of the present specification, Ra and Rb are each

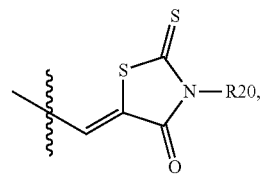

and R20 is an alkyl group having 1 to 10 carbon atoms.

In an exemplary embodiment of the present specification, Ra and Rb are each

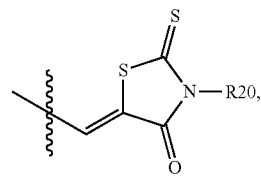

and R20 is an ethyl group.

In an exemplary embodiment of the present specification, Formula 1 may be represented by any one of the following Formulae 1-11 to 1-16.

[Formula 1-11]
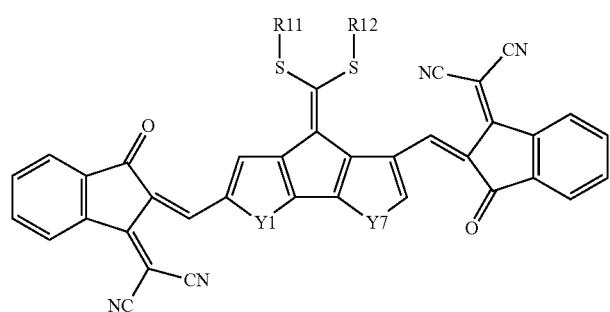
[Formula 1-12]
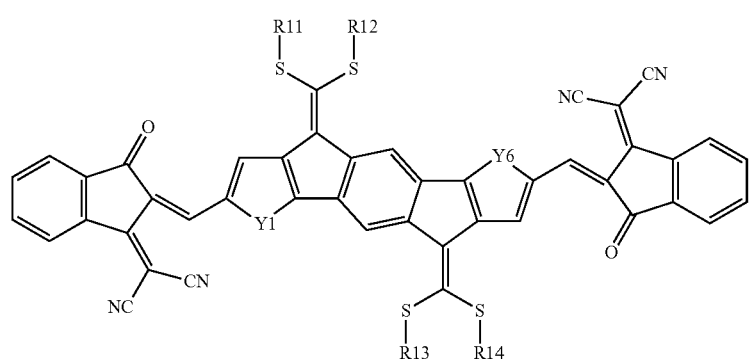
[Formula 1-13]
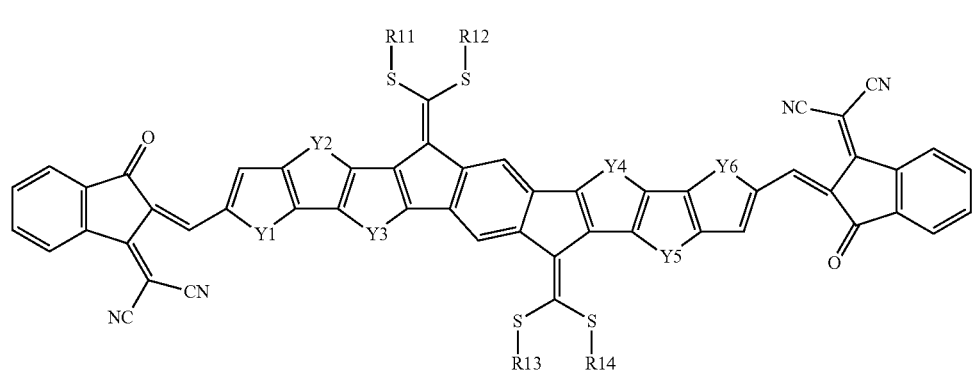
[Formula 1-14]
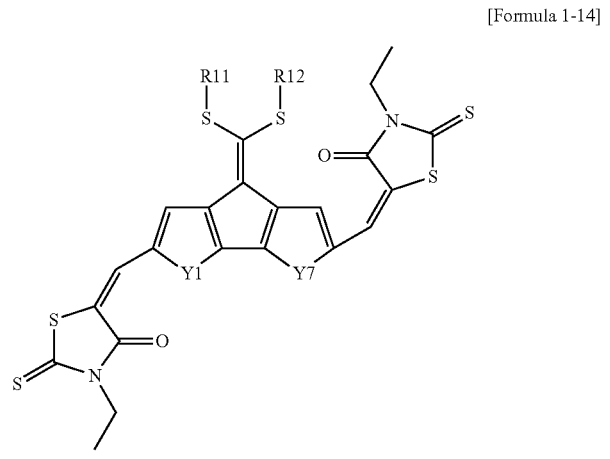
[Formula 1-15]
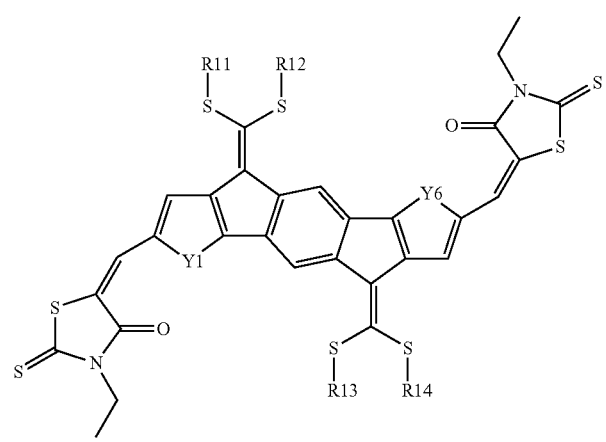

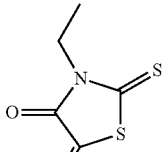

[Formula 1-16]

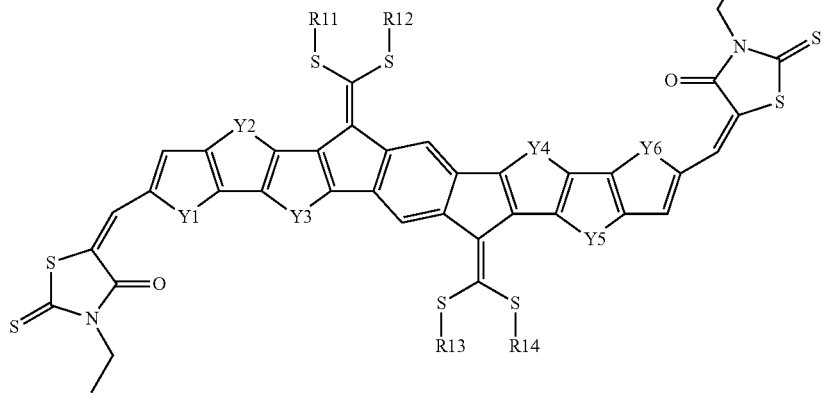

In Formulae 1-11 to 1-16,

Y6 and Y7 are the same as or different from each other, and are each independently CRR', NR, O, SiRR', PR, S, GeRR', Se, or Te, and Y1 to Y5, R11 to R14, R, and R' are the same as those defined in Formula 1.

In an exemplary embodiment of the present specification, Y1 to Y7 are each S.

In an exemplary embodiment of the present specification, R11 to R14 are the same as or different from each other, and are each independently a substituted or unsubstituted alkyl group; or a substituted or unsubstituted aryl group.

In an exemplary embodiment of the present specification, R11 to R14 are the same as or different from each other, and are each independently a substituted or unsubstituted alkyl group.

In an exemplary embodiment of the present specification, R11 to R14 are the same as or different from each other, and are each independently a substituted or unsubstituted alkyl group having 1 to 30 carbon atoms.

In an exemplary embodiment of the present specification, R11 to R14 are the same as or different from each other, and are each independently a substituted or unsubstituted alkyl group having 1 to 20 carbon atoms.

In an exemplary embodiment of the present specification, R11 to R14 are the same as or different from each other, and are each independently a substituted or unsubstituted alkyl group having 1 to 10 carbon atoms.

In an exemplary embodiment of the present specification, R11 to R14 are the same as or different from each other, and are each independently an alkyl group substituted with an aryl group substituted with an alkyl group.

In an exemplary embodiment of the present specification, R11 to R14 are the same as or different from each other, and are each independently an alkyl group substituted with a phenyl group substituted with an alkyl group.

In an exemplary embodiment of the present specification, R11 to R14 are the same as or different from each other, and are each independently an alkyl group substituted with a phenyl group substituted with a hexyl group.

In an exemplary embodiment of the present specification, R11 to R14 are the same as or different from each other, and are each independently a methyl group substituted with a phenyl group substituted with a hexyl group.

In an exemplary embodiment of the present specification, R11 to R14 are the same as or different from each other, and are each independently a straight-chained or branched alkyl group having 1 to 10 carbon atoms.

In an exemplary embodiment of the present specification, R11 to R14 are each a 2-ethyl hexyl group.

In an exemplary embodiment of the present specification, R11 to R14 are each a 2,6-dimethyloctane group.

In an exemplary embodiment of the present specification, Formula 1 is represented by any one of the following structures.

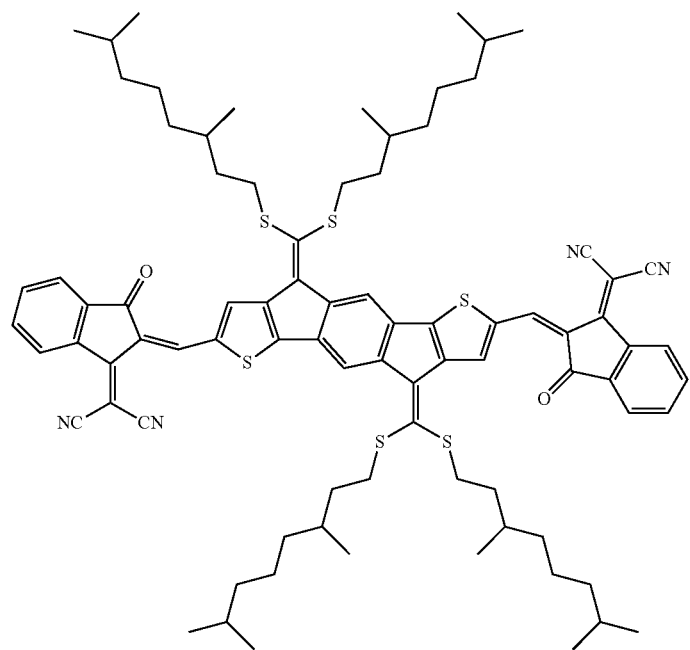
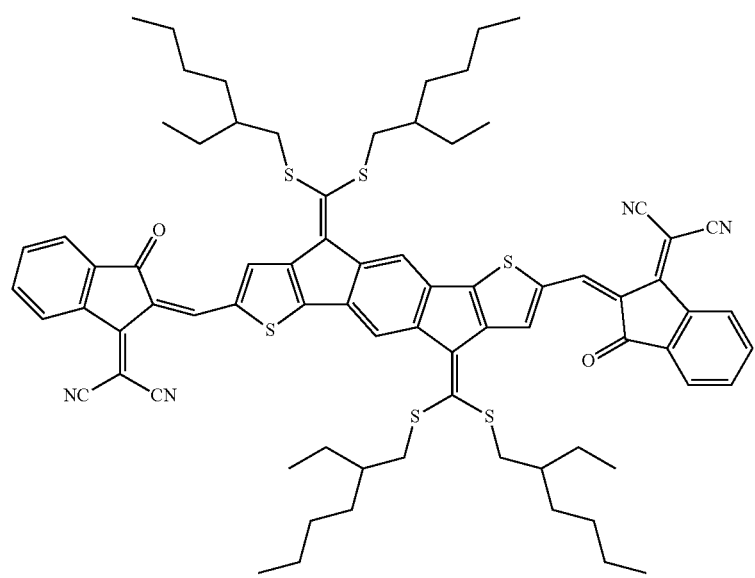

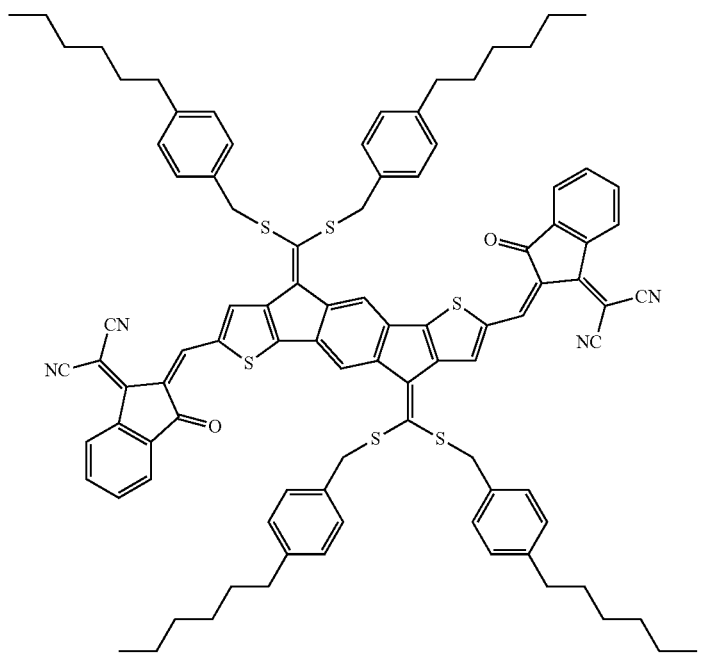
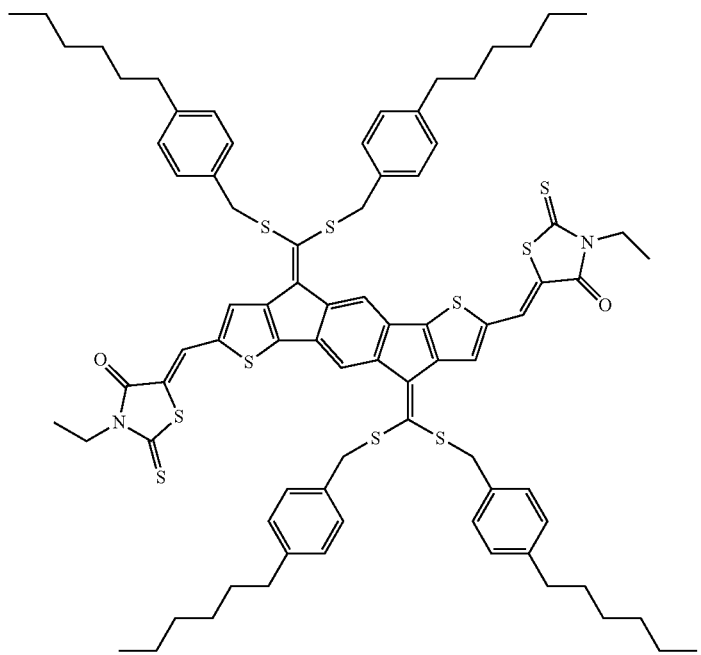

In an exemplary embodiment of the present specification, the organic transistor may have a top gate structure. Specifically, a source electrode 40 and a drain electrode 50 may be first formed on a substrate 10, and then an organic semiconductor layer 60, an insulating layer 30, and a gate electrode 20 may be sequentially formed. FIG. 1 illustrates the structure of the organic transistor.

Figure 2:
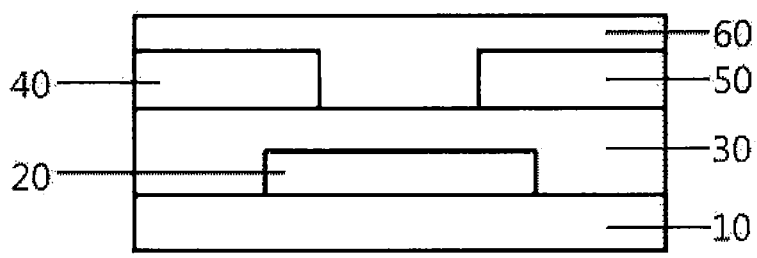
Figure 3:
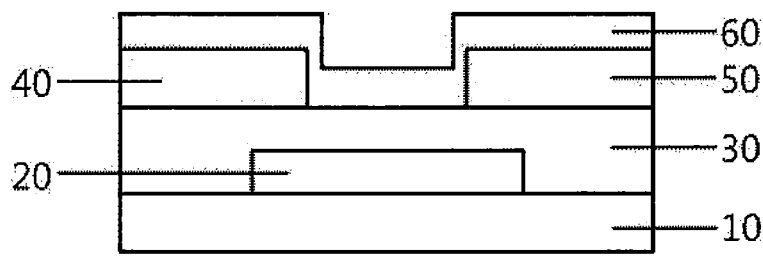

In an exemplary embodiment of the present specification, the organic transistor may have a bottom contact structure in the bottom gate structure. Specifically, the gate electrode 20 and the insulating layer 30 may be sequentially formed on the substrate 10, and then the source electrode 40 and the drain electrode 50 may be formed on the insulating layer 30, and finally, the organic semiconductor layer 60 may be formed on the source electrode 40 and the drain electrode 50. FIGS. 2 and 3 illustrate the structure of the organic transistor.

Figure 4:
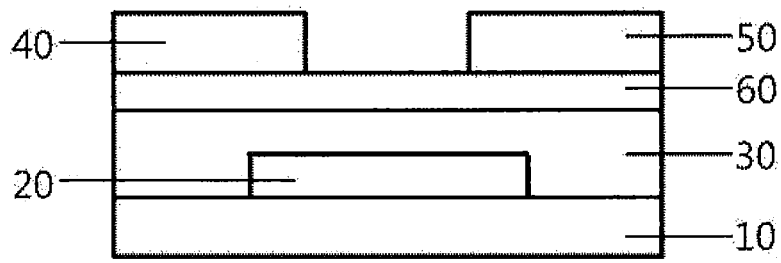

In an exemplary embodiment of the present specification, the organic transistor may have a top contact structure in the bottom gate structure. Specifically, the gate electrode 20 and the insulating layer 30 may be sequentially formed on the substrate 10, and then the organic semiconductor layer 60 may be formed on the insulating layer 30, and finally, the source electrode 40 and the drain electrode 50 may be formed on the organic semiconductor layer 60. FIG. 4 illustrates the structure of the organic transistor.

In an exemplary embodiment of the present specification, the insulating layer is provided to be in contact with the organic semiconductor layer.

In an exemplary embodiment of the present specification, the source electrode and the drain electrode are provided at a predetermined interval so as not to be in contact with each other.

In an exemplary embodiment of the present specification, the source electrode and the drain electrode are provided to be partially in contact with a surface opposite to a surface on which the organic semiconductor layer is brought into contact with the insulating layer.

The organic transistor of the present specification may be manufactured by the materials and methods known in the art, except that one or more layers of the organic semiconductor layer include the compound of Formula 1.

When the organic transistor includes a plurality of organic semiconductor layers, the organic semiconductor layers may be formed of the same material or different materials.

In an exemplary embodiment of the present specification, the organic semiconductor layer is provided as a single layer. In this case, the organic semiconductor layer provided as a single layer includes the compound.

In the present specification, the substrate 10 may be formed of a transparent substrate such as glass, a silicon substrate, or plastic. As the plastic substrate material, it is possible to use one or more selected from polyethersulfone (PES), polyacrylate (PAR), polyetherimide (PET), polyethylenenaphthalate (PEN), polyethyleneterephthalate (PET), polyphenylene sulfide (PPS), polyarylate, polyimide, polycarbonate (PC), tri-acetyl-cellulose (TAC), and cellulose acetate propionate (CAP). Preferably, it is possible to use a transparent substrate such as glass through which UV can transmit.

In the present specification, the gate electrode 20 may be in the form of a pattern, but the form is not limited thereto. The gate electrode 20 may be formed of any one selected from gold (Au), nickel (Ni), copper (Cu), silver (Ag), aluminum (Al), an aluminum-alloy (Al-alloy), molybdenum (Mo), and a molybdenum-alloy (Mo-alloy).

In the present specification, the gate electrode 20 may be formed by using a method selected from a photolithography method, an off-set printing method, a silk screen printing method, an inkjet printing method, a thermal deposition method, and a method using a shadow mask, but the method is not limited thereto.

The gate electrode 20 may have a thickness of 10 nm to 300 nm, preferably 10 nm to 50 nm.

In the present specification, the insulating layer 30 is composed of a single film or a multilayer film of an organic insulating film or inorganic insulating film or is composed of an organic-inorganic hybrid film. As the inorganic insulating film, it is possible to use any one or a plurality selected from a silicon oxide film, a silicon nitride film, $Al_2O_3$, $Ta_2O_5$, BST, and PZT. As the organic insulating film, it is possible to use any one or a plurality selected from CYTOP™, polymethylmethacrylate (PMMA), polystyrene (PS), a phenol-based polymer, an acrylic polymer, an imide-based polymer such as polyimide, an aryl ether-based polymer, an amide-based polymer, a fluorine-based polymer, a p-xylene-based polymer, a vinyl alcohol-based polymer, and parylene, but the organic insulating film is not limited thereto.

In the present specification, the insulating layer 30 may be formed through a solution process, and may be applied to a large area through spin coating, bar coating, slit die coating, doctor blade, and the like. Preferably, the insulating layer may be formed through spin coating, but the formation method is not limited thereto. When the insulating layer is formed, the used solvent may be completely evaporated by performing a heat treatment at 100° C. to 150° C. for 30 minutes or more.

In the present specification, the source electrode 40 and the drain electrode 50 may consist of a conductive material, and examples of the conductive material include carbon, aluminum, vanadium, chromium, copper, zinc, silver, gold, magnesium, calcium, sodium, potassium, titanium, indium, yttrium, lithium, gadolinium, tin, lead, neodymium, platinum, nickel, similar metals, and an alloy thereof; p- or n-doped silicon; zinc oxide, indium oxide, indium tin oxide (ITO), indium zinc oxide, similar tin oxide, and tin oxide indium-based complex compounds; a combination of an oxide and a metal such as ZnO:Al and $SnO_2$:Sb; a conductive polymer such as poly(3-methylthiophene), poly[3,4-(ethylene-1,2-dioxy)thiophene], polypyrrole, and polyaniline; and the like, but are not limited thereto.

In the present specification, the organic semiconductor layer 60 may be formed through a solution process. In this case, the organic semiconductor layer 60 may be typically applied to a large area through spin coating, bar coating, slit die coating, doctor blade, inkjet coating, and the like, but the application method is not limited thereto.

In the present specification, when the source electrode and the drain electrode 50 are formed on the substrate 10, the source electrode 40 and the drain electrode 50 may be formed by using a thermal deposition method, but the formation method is not limited thereto, and the source electrode 40 and the drain electrode 50 may be formed by other methods publicly known in the art. In this case, the interval between the source electrode 40 and the drain electrode 50 typically has a channel length of 2 µm to several hundred µm, and the channel width may be 10 times to 1,000 times the channel length. The source electrode 40 and the drain electrode 50 are typically manufactured of gold and nickel, but other electrodes such as silver, copper, and molybdenum may also be used.

In the present specification, when the source electrode 40 and the drain electrode 50 are formed on the organic semiconductor layer 60, the source electrode 40 and the drain electrode 50 may be formed by using a photo-etching process or a shadow mask process, but the formation method is not limited thereto, and the source electrode 40 and the drain electrode 50 may be formed by other methods publicly known in the art.

In an exemplary embodiment of the present specification, the P-type characteristics are confirmed by applying a minus voltage to a gate electrode, and then measuring an electric current flowing between a source electrode and a drain electrode. When the P-type characteristics are exhibited, holes move in the organic semiconductor layer if a minus voltage is applied to the gate electrode.

In an exemplary embodiment of the present specification, the N-type characteristics are confirmed by applying a plus voltage to a gate electrode, and then measuring an electric current flowing between a source electrode and a drain electrode. When the N-type characteristics are exhibited, electrons move in the organic semiconductor layer if a plus voltage is applied to the gate electrode.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

Preparation Example 1. Production of Compound 1

(1) Production of Compound A-2

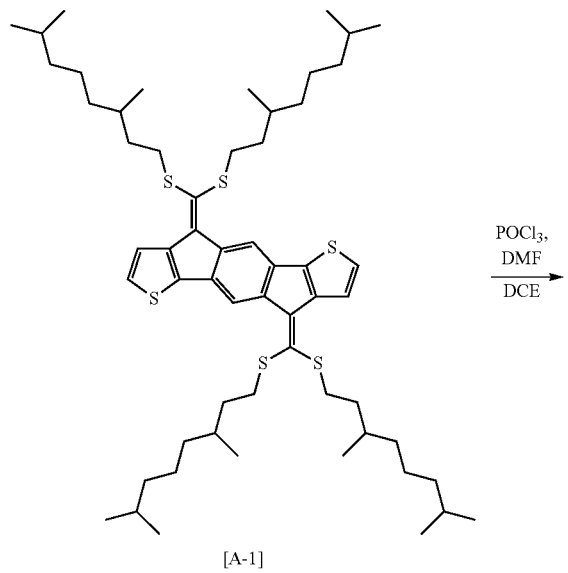

[A-1]

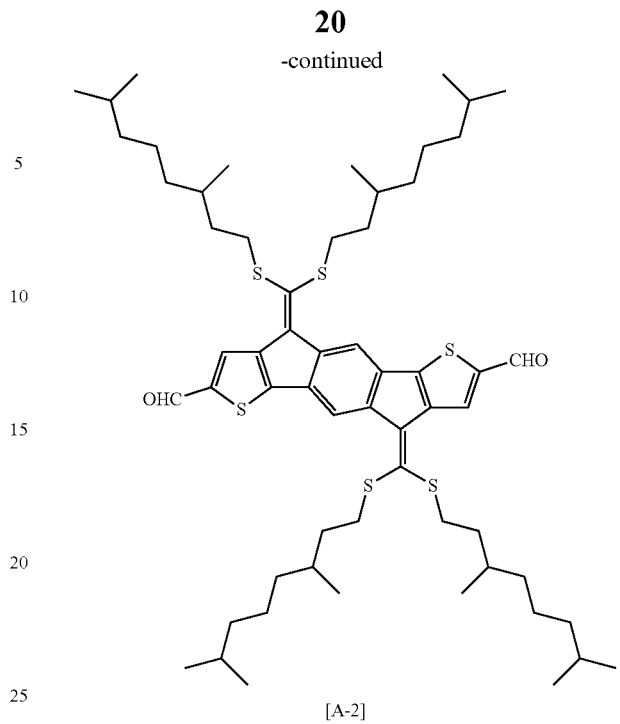

[A-2]

1.49 mL of phosphorus oxychloride ($POCl_3$)(16 mmol) was added to 1.55 mL of N,N-dimethylformamide (DMF) (20 mmol), and the resulting mixture was stirred at 0° C. for 60 minutes to prepare a mixed solution. A solution, in which Compound A-1 (1.53 mmol) was dissolved in 20 mL of dichloroethane (DCE), was added to the prepared mixed solution, and the resulting mixture was stirred at 100° C. for 48 hours. After the stirring, 1 M sodium hydroxide (NaOH) was added thereto, and the resulting mixture was stirred for 1 hour for neutralization. Thereafter, the product was extracted with dichloromethane, and the extract was dried over anhydrous magnesium sulfate ($MgSO_4$) and evaporated. After the solvent was removed under reduced pressure, the residue was purified through flash chromatography (hexane:chloroform=4:1) using hexane and chloroform as an eluent to obtain 1.066 g of Compound A-2 (yield: 67.3%).

Figure 5:
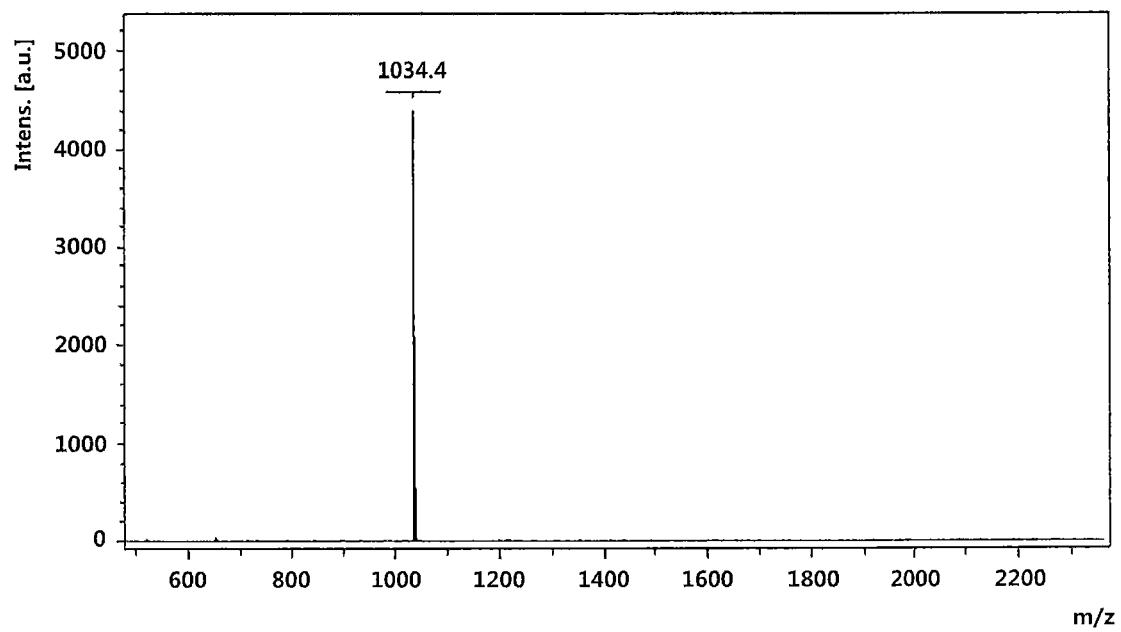
FIG. 5 is a view illustrating an MS spectrum of Compound A-2.

FIG. 5 is a view illustrating an MS spectrum of Compound A-2.

(2) Production of Compound 1

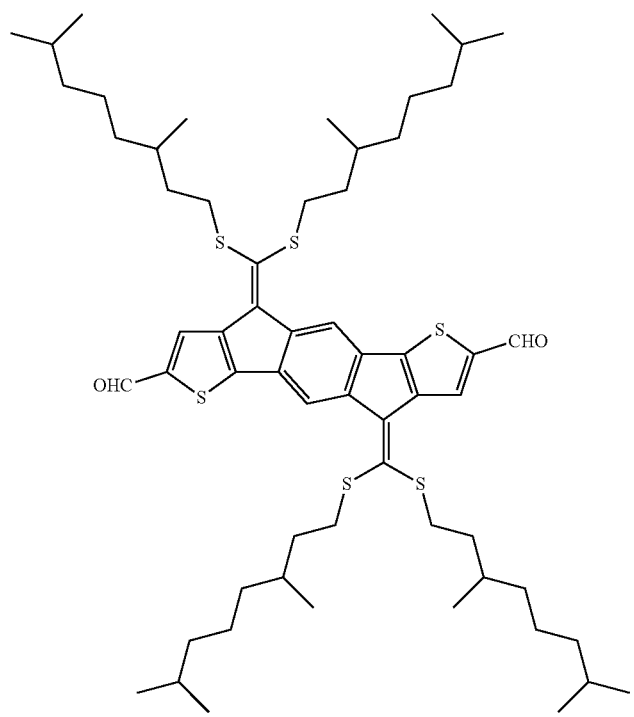

[A-2]

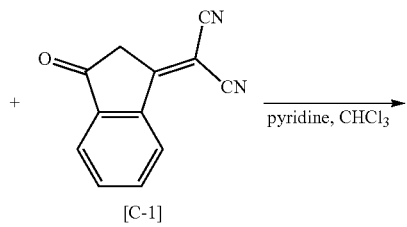

[C-1]

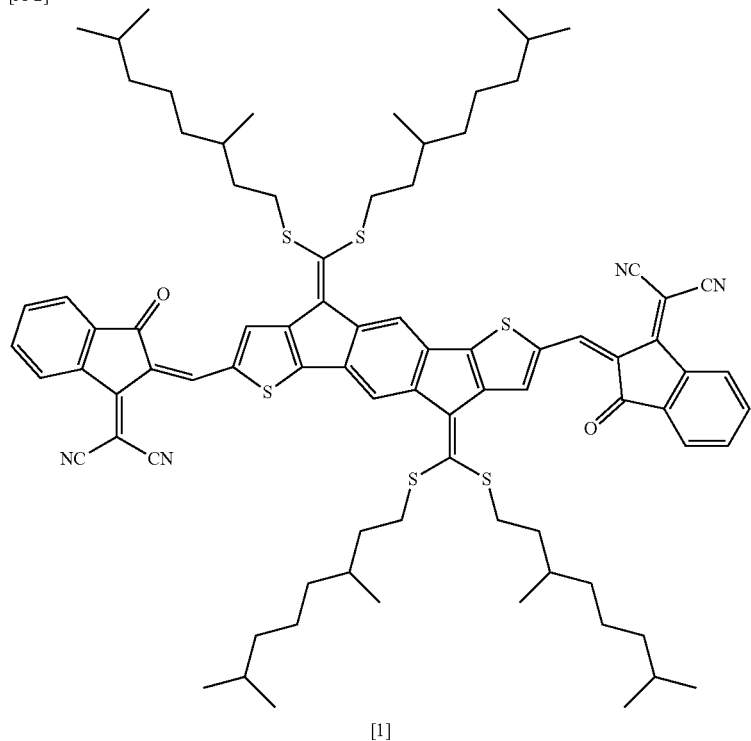

[1]

2 mL of pyridine was added to a solution in which Compound A-2 (0.725 g, 0.7 mmol) and Compound C-1 (0.68 g, 3.5 mmol) were mixed in 40 mL of chloroform (CHCl$_3$) under a nitrogen (N$_2$) atmosphere. After this mixed solution was refluxed under a nitrogen atmosphere for 24 hours, the product was extracted with dichloromethane (CH$_2$Cl$_2$), and washed with water. After the solvent was removed, the residue was recrystallized through methyl chloride (MC)/methanol, the product was purified through chromatography using a silica gel column using hexane, acetone, ethyl acetate, and chloroform (CHCl$_3$) as an eluent. The produced solid was recrystallized through chloroform.

Thereafter, the product was washed with methanol and dried under a vacuum condition to obtain 905 mg of Compound 1 (yield: 93%).

Figure 6:
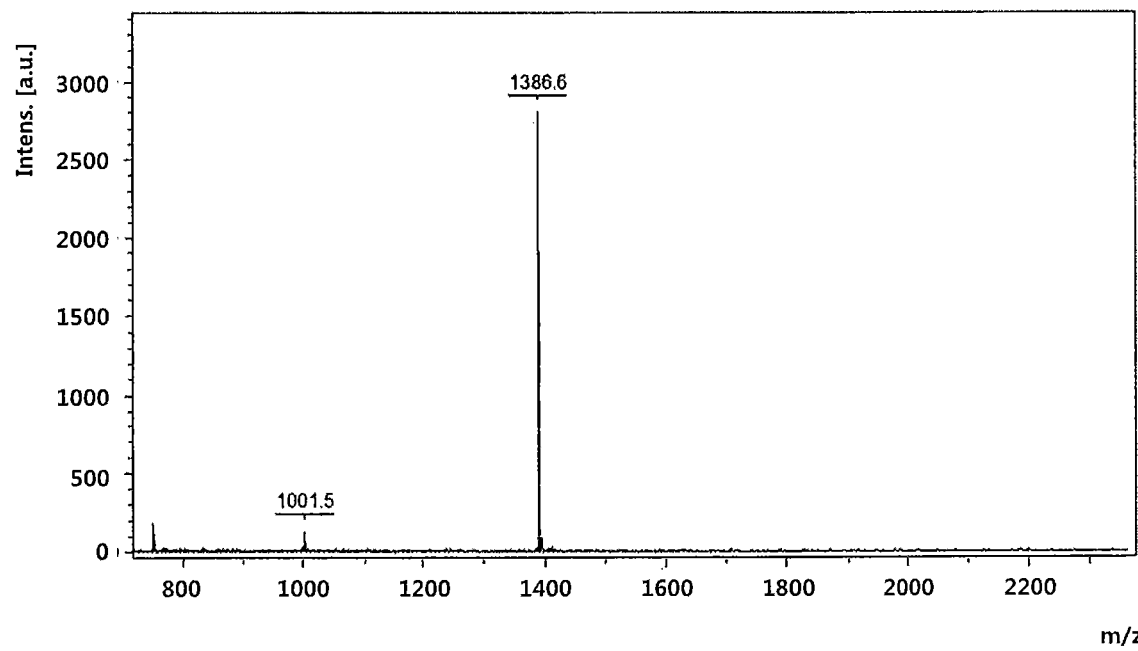
FIG. 6 is a view illustrating an MS spectrum of Compound 1.

FIG. 6 is a view illustrating an MS spectrum of Compound 1.

Figure 7:
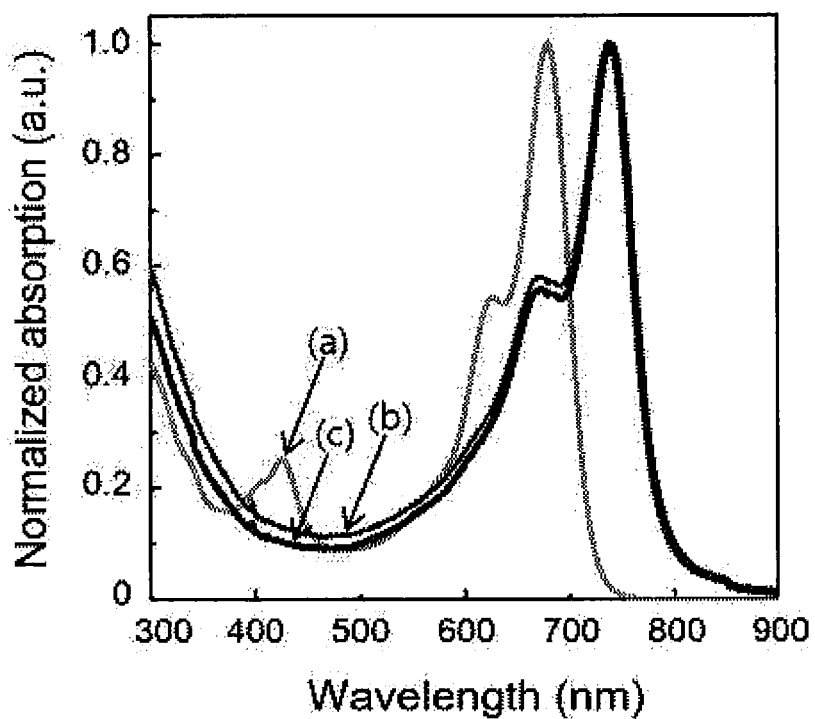
FIG. 7 is a view illustrating a UV measurement result of Compound 1.

FIG. 7 is a view illustrating a UV measurement result of Compound 1.

In FIG. 7, (a) is UV data of Compound 1 in a solution state, (b) is UV data of Compound 1 in a film state, and (c) is UV data obtained by measuring Compound 1 after being subjected to a heat treatment at 110° C. for 10 minutes in a film state.

The solution state means that Compound 1 is dissolved in a chloroform solution, and the film state means that the solution is spin-coated, and then dried to form a film state.

Figure 8:
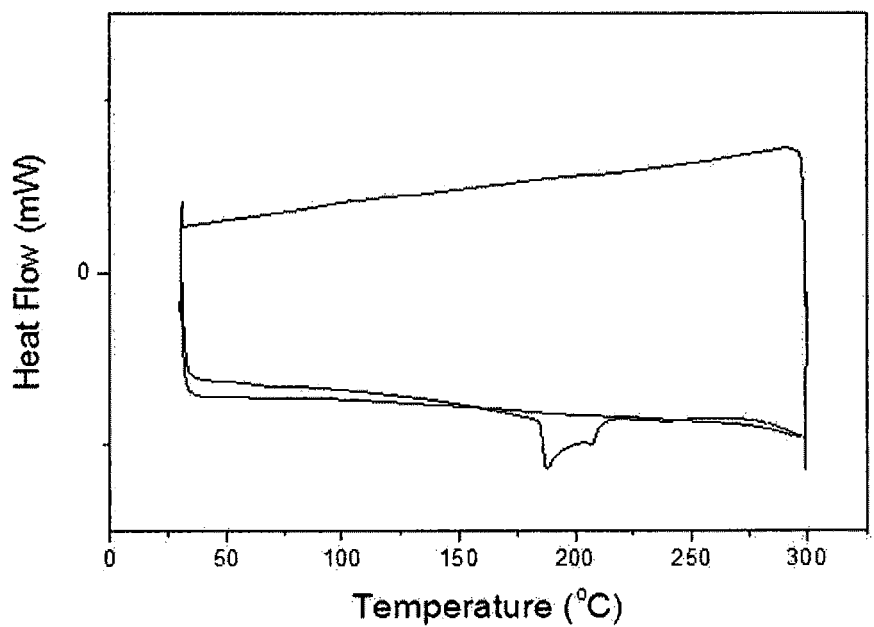
FIG. 8 is a view illustrating a DSC measurement result of Compound 1.

FIG. 8 is a view illustrating a DSC measurement result of Compound 1.

Figure 9:
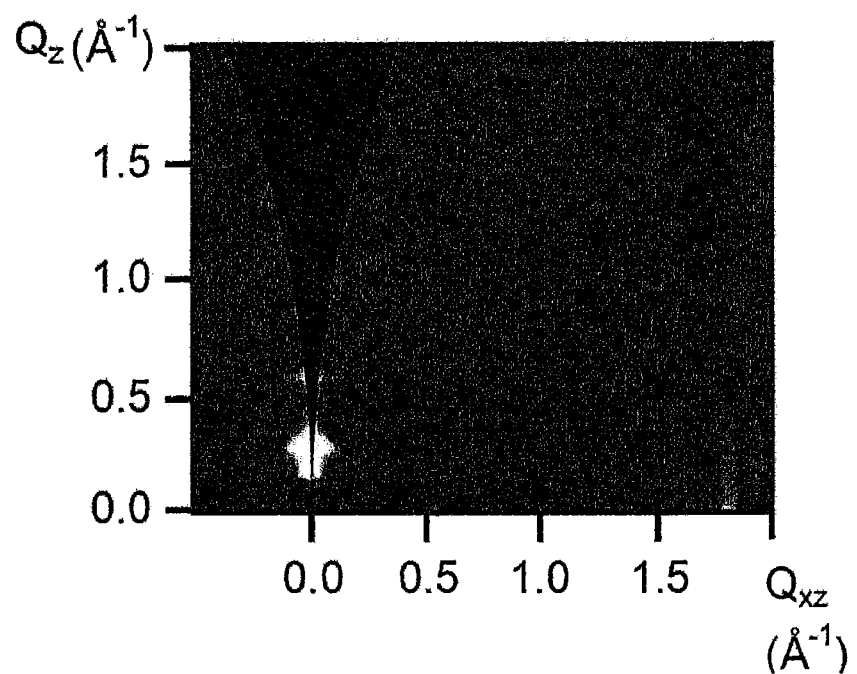
FIG. 9 is a view illustrating a GIWAXS measurement result of Compound 1.

FIG. 9 is a view illustrating a GIWAXS measurement result of Compound 1.

Figure 10:
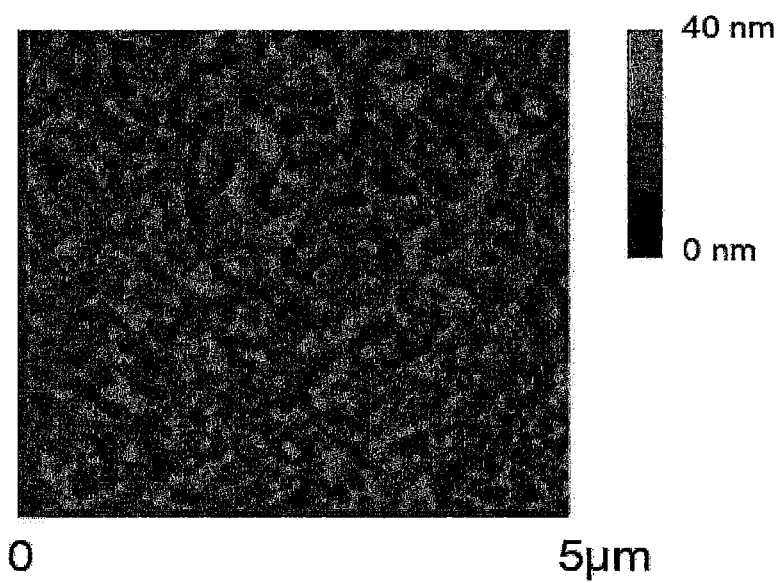
FIG. 10 is a view illustrating an AFM measurement result of Compound 1.

FIG. 10 is a view illustrating an AFM measurement result of Compound 1.

Preparation Example 2. Production of Compound 2

(1) Production of Compound B-2

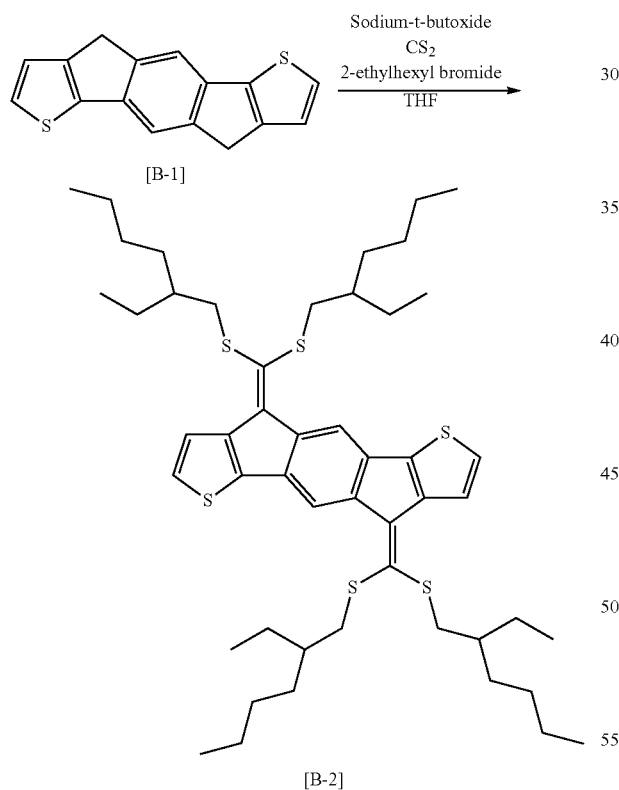

After 4.13 g (43 mmol) of sodium-t-butoxide (NaOC(CH$_3$)$_3$) was added to 100 mL of tetrahydrofuran (THF) in which Compound B-1 (2.5 g, 9.4 mmol) was dissolved, a total of 2.58 mL of carbon disulfide (CS$_2$) (43 mmol) was added thereto for 1 hour. Thereafter, 8.89 mL (50 mmol) of 2-ethylhexyl bromide was added thereto, and the resulting mixture was stirred for 24 hours. After the reaction, the reaction was terminated by adding ammonium hydroxide (NH$_4$OH) thereto, and the resulting product was extracted with dichloromethane (DCM), and then washed three times with water. The product was purified through chromatography using a silica gel column using hexane as an eluent to obtain 3.63 g of Compound B-2 in the form of red oil (yield; 45%).

Figure 11:
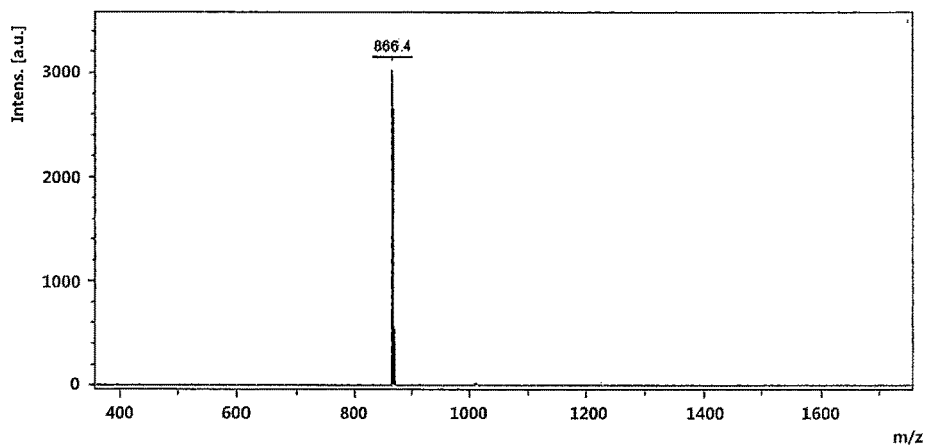
FIG. 11 is a view illustrating an MS spectrum of Compound B-2.

FIG. 11 is a view illustrating an MS spectrum of Compound B-2.

(2) Production of Compound B-3

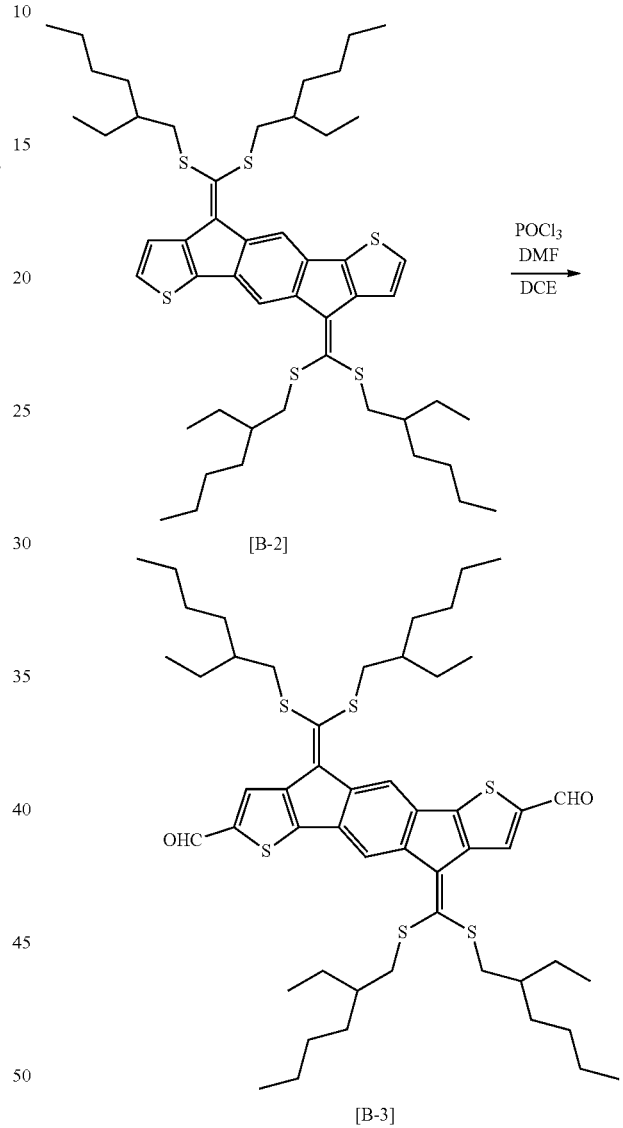

4 mL of phosphorus oxychloride (POCl$_3$) (43 mmol) was added to N,N-dimethylformamide (DMF)(55 mmol), and the resulting mixture was stirred at 0° C. for 60 minutes to prepare a mixed solution. A solution, in which Compound B-2 (4.19 mmol) was dissolved in 40 mL of dichloroethane (DCE), was added to the prepared mixed solution, and the resulting mixture was stirred at 100° C. for 48 hours. After the stirring, 1 M sodium hydroxide (NaOH) was added thereto, and the resulting mixture was stirred for 1 hour for neutralization. Thereafter, the product was extracted with dichloromethane, and the extract was dried over anhydrous magnesium sulfate (MgSO$_4$) and evaporated. After the solvent was removed under reduced pressure, the residue was purified through flash chromatography (hexane:chloroform=4:1) using hexane and chloroform as an eluent to obtain 2.47 g of Compound B-3 (yield: 64%).

Figure 12:
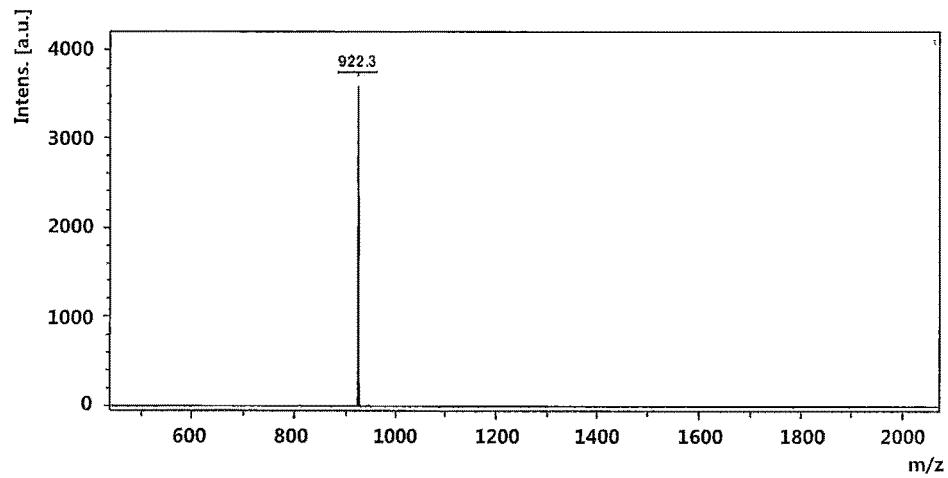
FIG. 12 is a view illustrating an MS spectrum of Compound B-3.

FIG. 12 is a view illustrating an MS spectrum of Compound B-3.

(3) Production of Compound 2

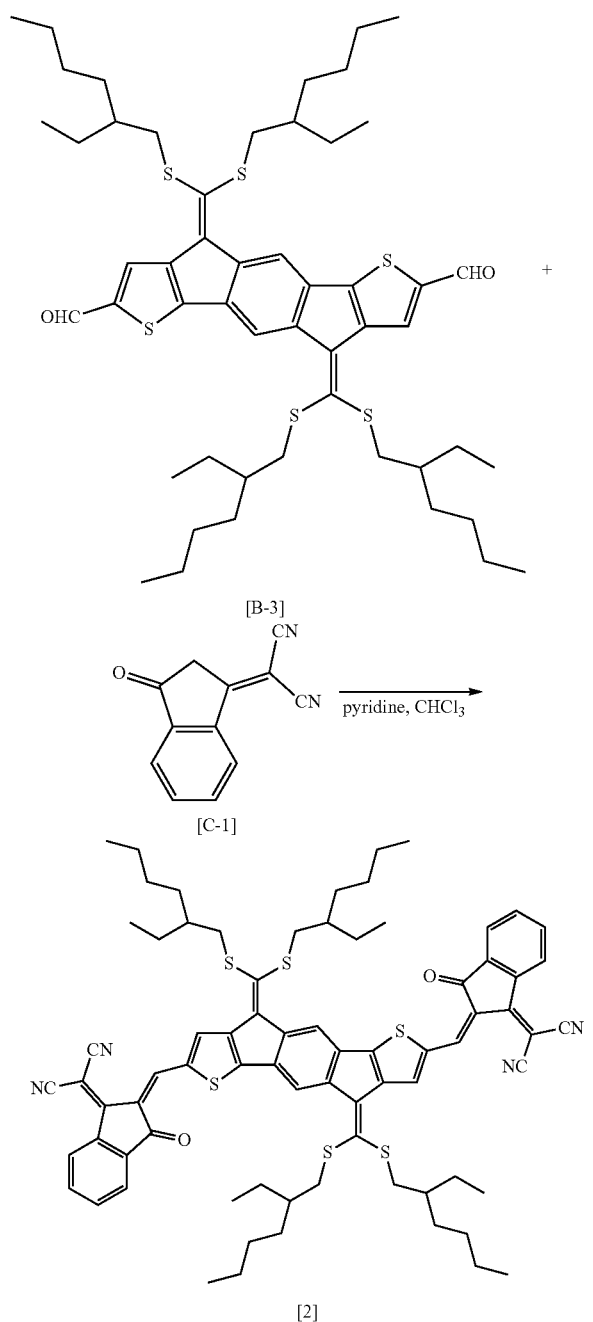

2 mL of pyridine was added to a solution in which Compound B-3 (0.44 g, 0.48 mmol) and Compound C-1 (0.93 g, 4.8 mmol) were mixed in 30 mL of chloroform ($CHCl_3$) under a nitrogen ($N_2$) atmosphere. After this mixed solution was refluxed under a nitrogen atmosphere for 24 hours, the product was extracted with dichloromethane ($CH_2Cl_2$), and washed with water. After the solvent was removed, the residue was recrystallized through methyl chloride (MC)/methanol, the product was purified through chromatography using a silica gel column using hexane, ethyl acetate, and chloroform ($CHCl_3$) as an eluent. The produced solid was recrystallized through chloroform. Thereafter, the product was washed with methanol and dried under a vacuum condition to obtain 550 mg of Compound 2 (yield: 90%).

Figure 13:
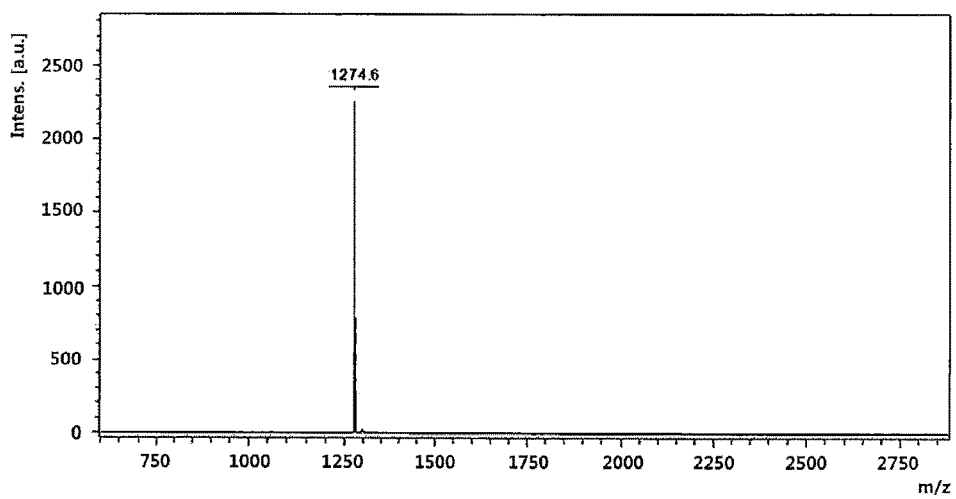
FIG. 13 is a view illustrating an MS spectrum of Compound 2.

FIG. 13 is a view illustrating an MS spectrum of Compound 2.

Figure 14:
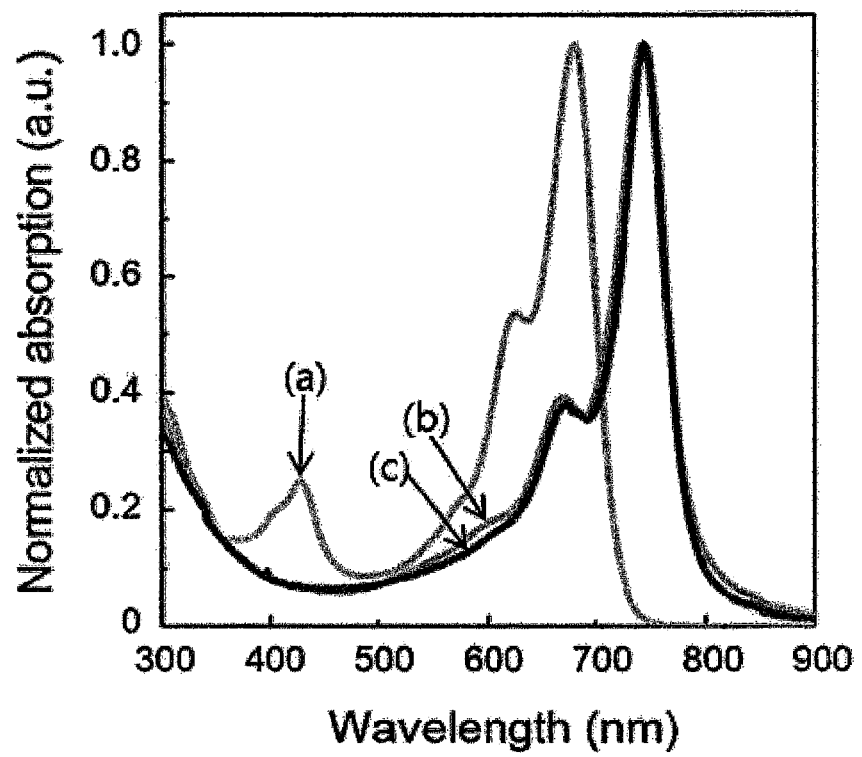
FIG. 14 is a view illustrating a UV measurement result of Compound 2.

FIG. 14 is a view illustrating a UV measurement result of Compound 2.

Figure 15:
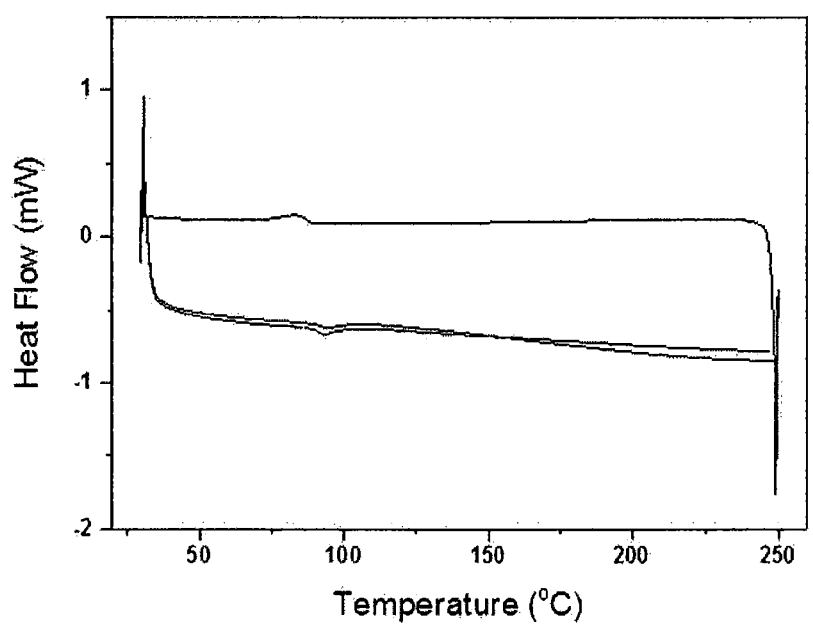
FIG. 15 is a view illustrating a DSC measurement result of Compound 2.

FIG. 15 is a view illustrating a DSC measurement result of Compound 2.

Figure 16:
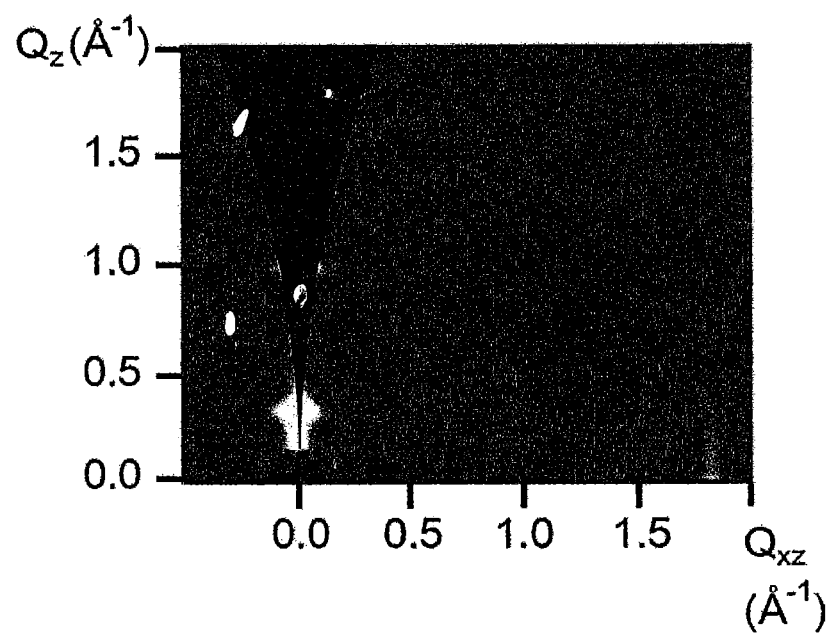
FIG. 16 is a view illustrating a GIWAXS measurement result of Compound 2.

FIG. 16 is a view illustrating a GIWAXS measurement result of Compound 2.

Figure 17:
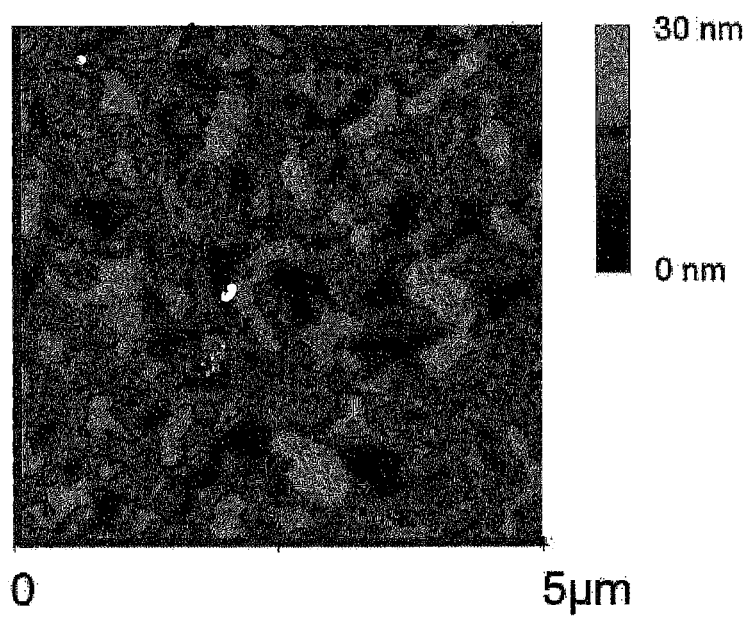
FIG. 17 is a view illustrating an AFM measurement result of Compound 2.

FIG. 17 is a view illustrating an AFM measurement result of Compound 2.

Figure 18:
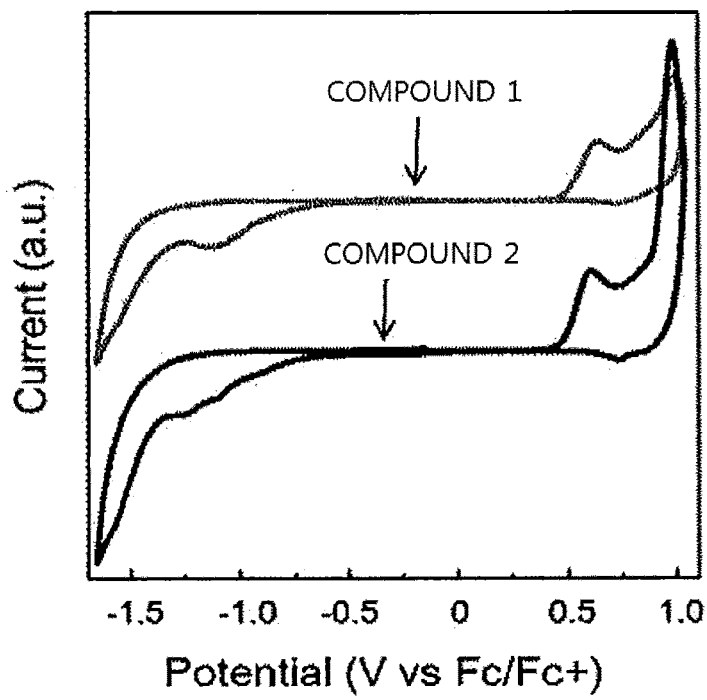
FIG. 18 is a view illustrating CV measurement results of Compounds 1 and 2.

FIG. 18 is a view illustrating CV measurement results of Compounds 1 and 2.

Comparative Example 1

A Stille reaction was attempted in order to add a linker between Compound B-3 and Compound C-1 during the production process of Compound 2, but the polymerization reaction did not occur because the catalyst was poisoned by S introduced into an alkyl group of Compound B-3.

Example 1

Source and drain electrodes of gold/nickel (Au/Ni) (13/3 nm) were formed on a washed glass substrate by using photolithography. The substrate on which source and drain electrodes were formed was washed with acetone, distilled water, and isopropyl alcohol, and then dried at 110° C. for 1 hour. The dried substrate was treated with UV/ozone for 30 minutes, and then put into a glove box. A solution in which Compound 1 was dissolved at a concentration of 3 mg/mL in chlorobenzene was spin-coated at 1,500 rpm on the substrate put into the glove box, and the substrate was heat-treated at 110° C. for 10 minutes. Thereafter, CYTOP (manufactured by Asahi Glass Co., Ltd.) was spin-coated at 2,000 rpm thereon, and the substrate was heat-treated at 90° C. for 1 hour, thereby forming an insulating layer. Aluminum (Al) was thermally deposited (thermal evaporation) to have a thickness of 50 nm on the insulating layer, thereby forming a gate electrode.

Example 2

An organic transistor was manufactured in the same manner as in Example 1, except that in the manufacturing method in Example 1, Compound 1 was spin-coated and heat-treated at 150° C. for 10 minutes.

Example 3

An organic transistor was manufactured in the same manner as in Example 1, except that in the manufacturing method in Example 1, Compound 1 was spin-coated and heat-treated at 200° C. for 10 minutes.

Example 4

An organic transistor was manufactured in the same manner as in Example 1, except that in the manufacturing method in Example 1, Compound 1 was spin-coated and heat-treated at 250° C. for 10 minutes.

Example 5

An organic transistor was manufactured in the same manner as in Example 1, except that in the manufacturing method in Example 1, Compound 2 was used instead of Compound 1.

Example 6

An organic transistor was manufactured in the same manner as in Example 2, except that in the manufacturing method in Example 2, Compound 2 was used instead of Compound 1.

Example 7

An organic transistor was manufactured in the same manner as in Example 3, except that in the manufacturing method in Example 3, Compound 2 was used instead of Compound 1.

Example 8

An organic transistor was manufactured in the same manner as in Example 4, except that in the manufacturing method in Example 4, Compound 2 was used instead of Compound 1.

Comparative Example 2

An organic transistor was attempted to be manufactured by using Compound B-2 produced in Preparation Example 2(1), but since Compound B-2 was in a state exhibiting viscosity, a film could not be manufactured, so that the organic transistor could not be manufactured.

Table 1 shows characteristics of the organic transistors manufactured in Examples 1 to 8.

TABLE 1

| | Compound | Heat treatment temperature (° C.) | N-type μ (cm²/Vs) | N-type $V_{th}$ (V) | P-type μ (cm²/Vs) | P-type $V_{th}$ (V) |
|---|---|---|---|---|---|---|
| Example 1 | Compound 1 | 110 | — | — | 0.148 | −39.54 |
| Example 2 | Compound 1 | 150 | — | — | 0.137 | −46.64 |
| Example 3 | Compound 1 | 200 | 0.052 | −52.40 | 0.035 | −60.16 |
| Example 4 | Compound 1 | 250 | 0.04 | −57.15 | 0.068 | −59.42 |
| Example 5 | Compound 2 | 110 | — | — | 0.023 | 68.24 |
| Example 6 | Compound 2 | 150 | — | — | 0.018 | 65.13 |
| Example 7 | Compound 2 | 200 | 0.02 | 70.75 | 0.004 | 71.33 |
| Example 8 | Compound 2 | 250 | 0.023 | 68.24 | 0.007 | 74.01 |

In Table 1, μ and Vth mean the charge mobility and the threshold voltage, respectively.

FIGS. 19 to 22 are views illustrating the evaluation of characteristics of an organic transistor according to an exemplary embodiment of the present specification.

Figure 19:
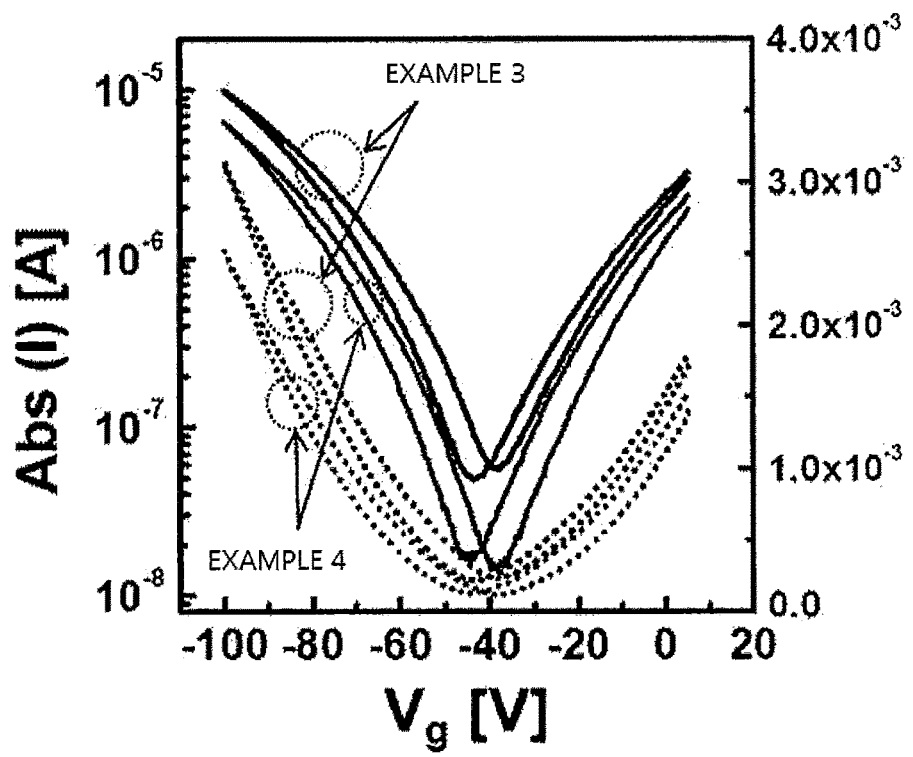
FIGS. 19 to 22 are views illustrating the evaluation of characteristics of an organic transistor according to an exemplary embodiment of the present specification.
Figure 20:
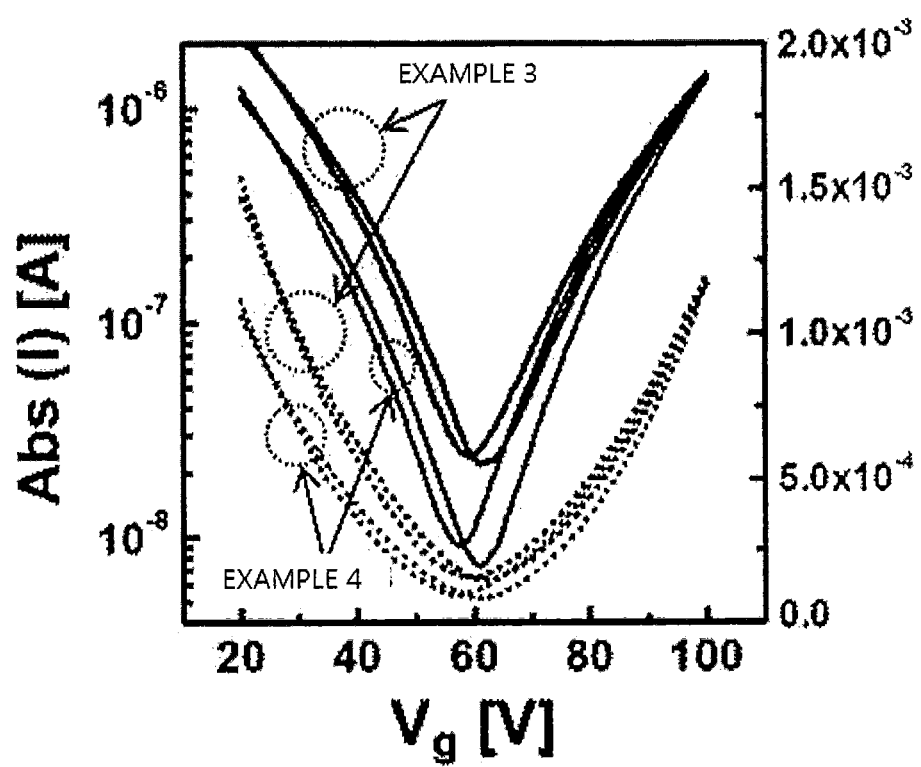
Figure 21:
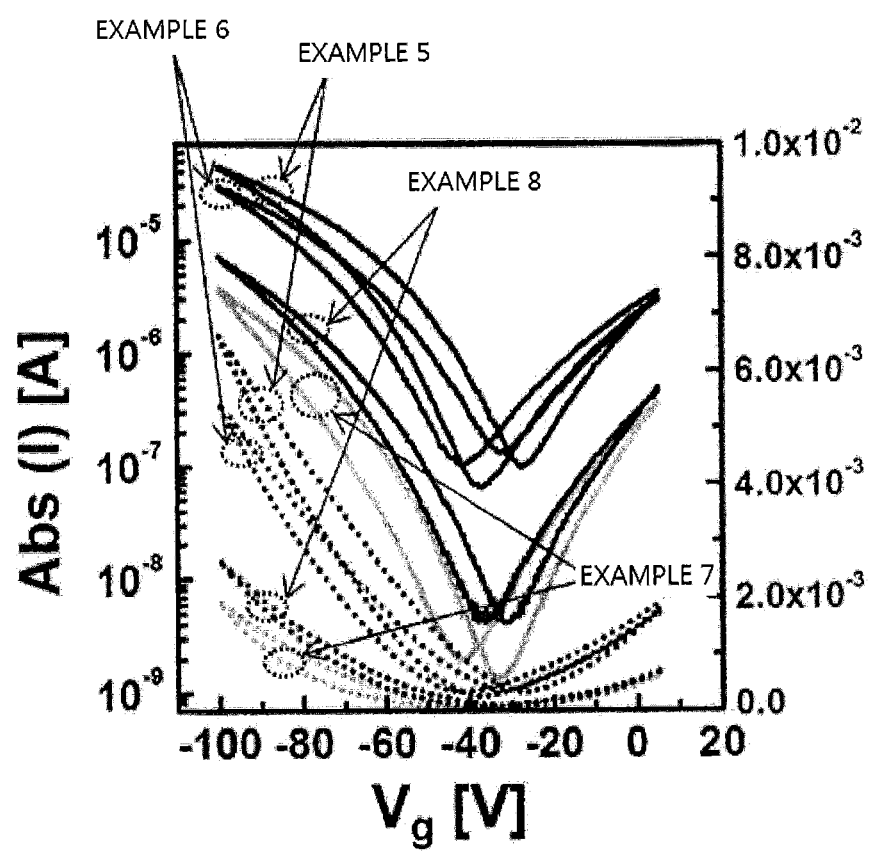
Figure 22:
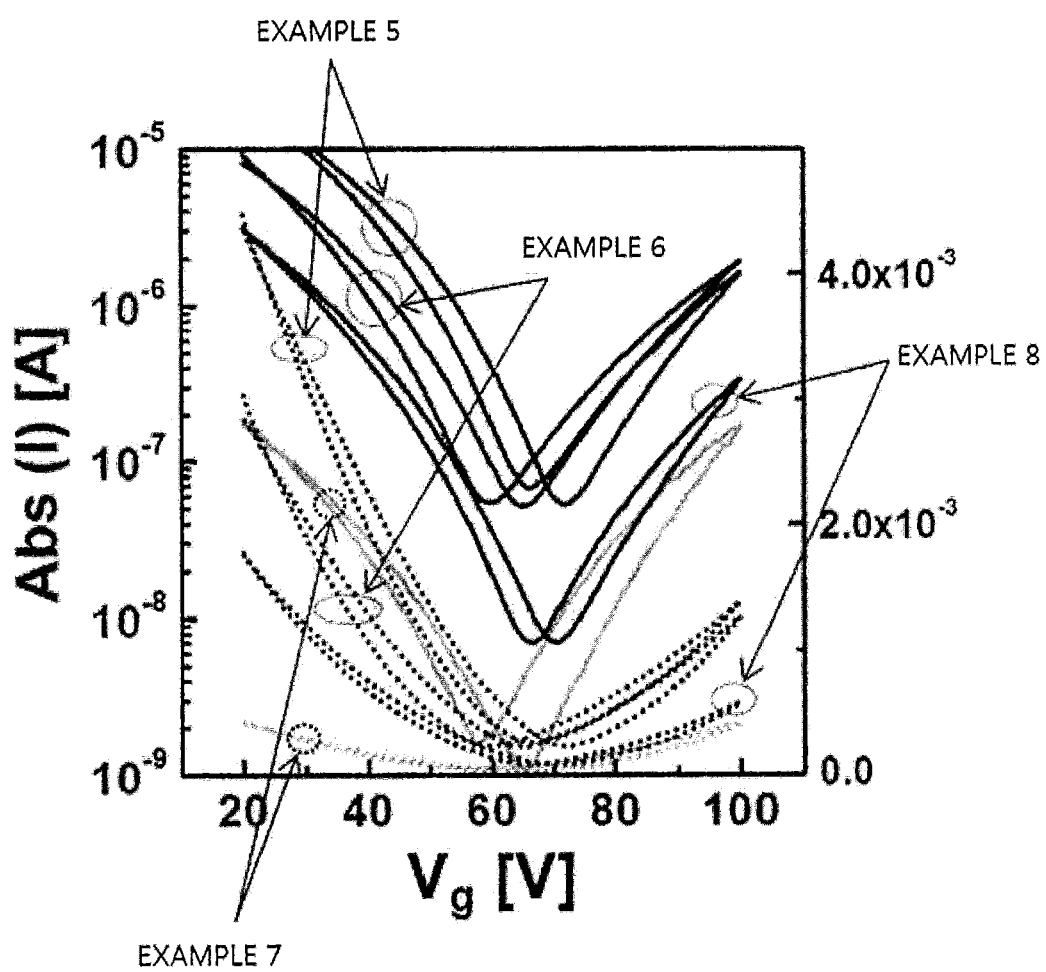

Specifically, FIG. 19 is a view illustrating P-type transfer curve results of Examples 3 and 4, FIG. 20 is a view illustrating N-type transfer curve results of Examples 3 and 4, FIG. 21 is a view illustrating P-type transfer curve results of Examples 5 to 8, and FIG. 22 is a view illustrating N-type transfer curve results of Examples 5 to 8.

What is claimed is:

1. An organic transistor comprising:
   a source electrode;
   a drain electrode;
   a gate electrode;
   an organic semiconductor layer comprising one or more layers; and
   an insulating layer between the gate electrode and the organic semiconductor layer,
   wherein the one or more layers of the organic semiconductor layer comprise a compound of Formula 3:

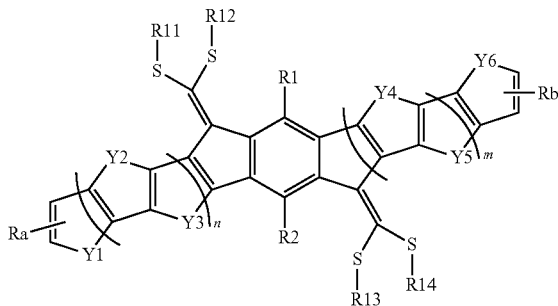

[Formula 3]

wherein:
   Ra and Rb are the same as or different from each other, and are each independently a group which serves as an electron acceptor;
   Y1 to Y5 are the same as or different from each other, and are each independently CRR', NR, O, SiRR', PR, S, GeRR', Se, or Te;
   Y6 is CRR', NR, O, SiRR', PR, S, GeRR', Se, or Te;
   n and m are each an integer from 0 to 5;
   when n and m are each 2 or more, the structures in the parenthesis are the same as or different from each other; and
   R1, R2, R11 to R14, R, and R' are the same as or different from each other, and are each independently hydrogen, deuterium, a substituted or unsubstituted alkyl group, a substituted or unsubstituted cycloalkyl group, a substituted or unsubstituted aryl group, or a substituted or unsubstituted heterocyclic group.

2. The organic transistor of claim 1, wherein the compound of Formula 3 is a compound of Formula 1-1:
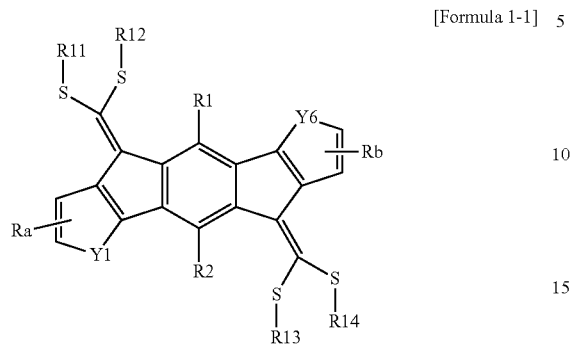
[Formula 1-1]
wherein:
Y6 is CRR', NR, O, SiRR', PR, S, GeRR', Se, or Te; and
Ra, Rb, Y1, R1, R2, R11 to R14, R, and R' are the same as those defined in Formula 3.
3. The organic transistor of claim 1, wherein the compound of Formula 3 is a compound of any one of structures:
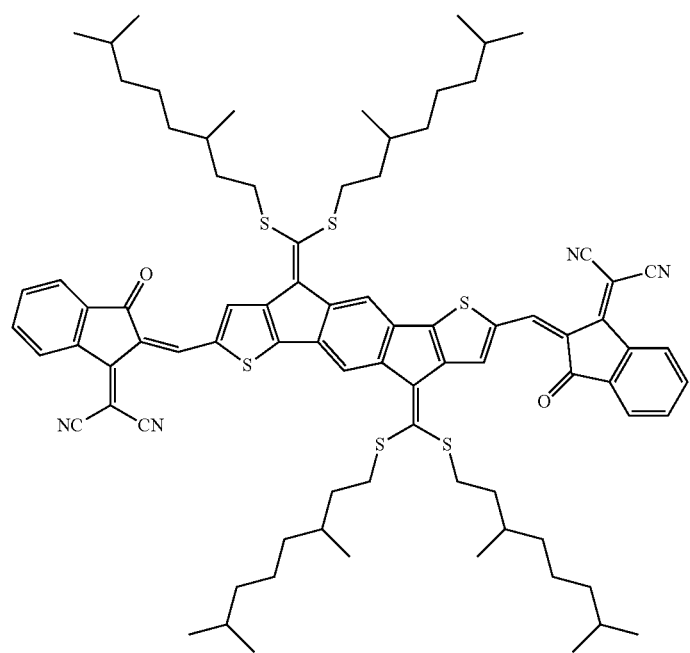

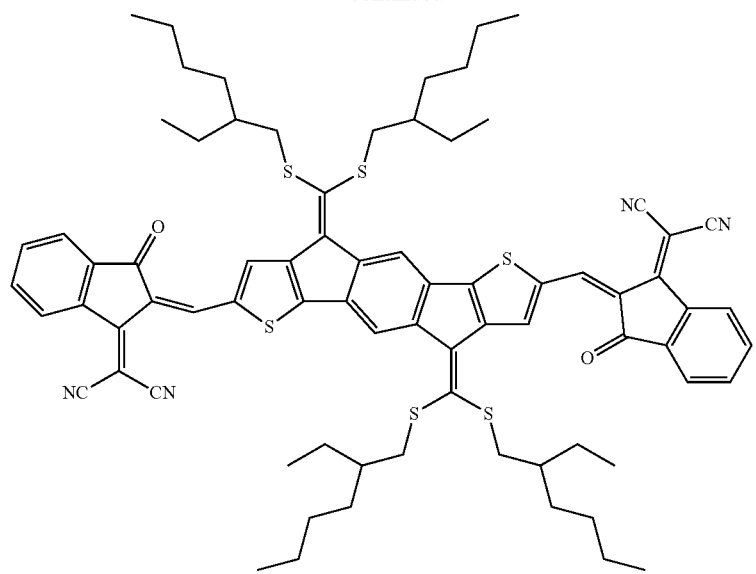
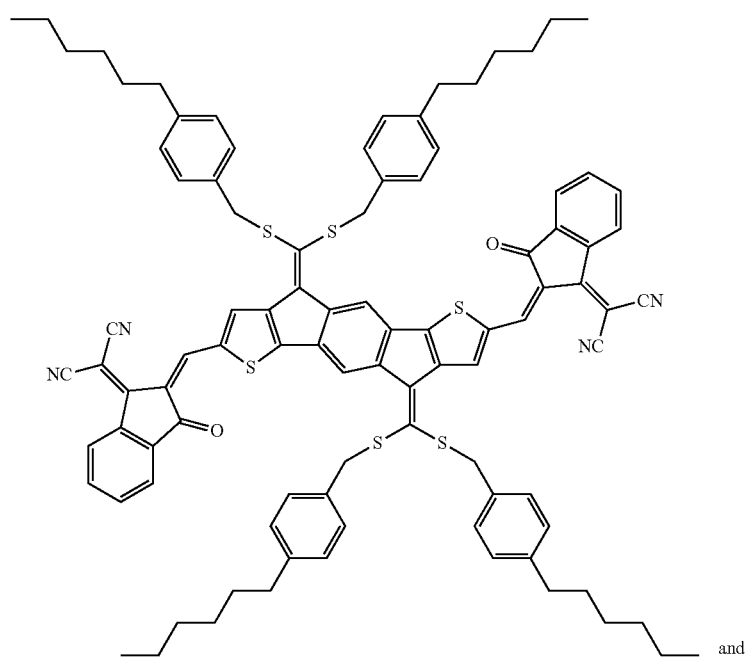
and

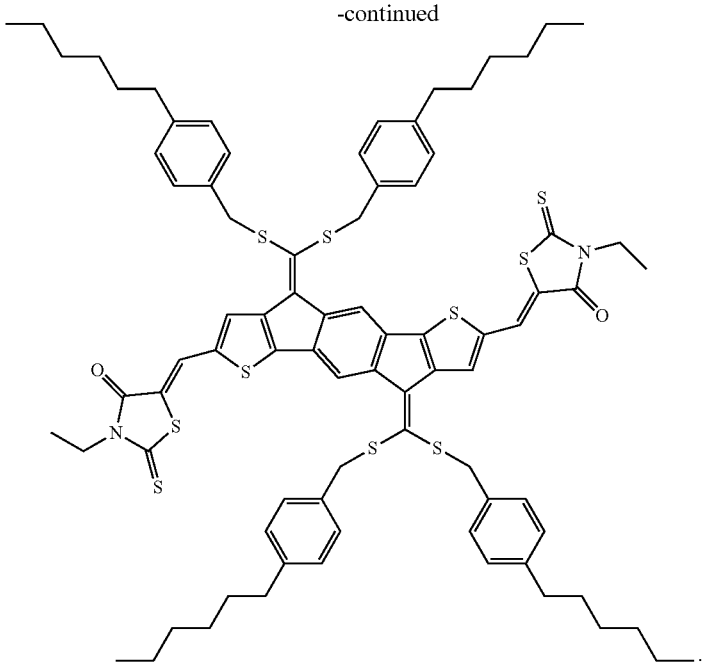

4. The organic transistor of claim 1, wherein Ra and Rb are the same as or different from each other, and are each any one of the following structures:

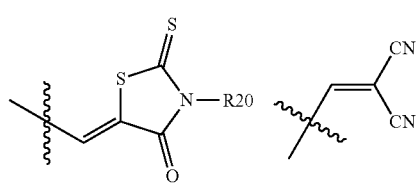

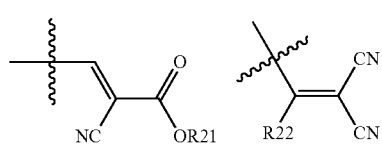

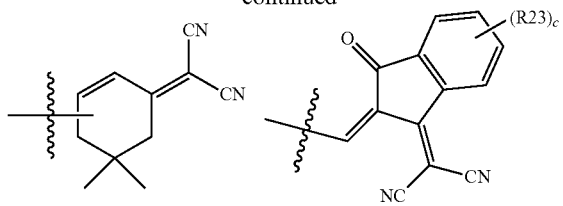

wherein:

c is an integer from 1 to 4;

when c is 2 or more, two or more structures in the parenthesis are the same as or different from each other; and R20 to R23 are the same as or different from each other, and are each independently hydrogen, deuterium, a halogen group, a substituted or unsubstituted alkyl group, a substituted or unsubstituted cycloalkyl group, a substituted or unsubstituted aryl group, or a substituted or unsubstituted heterocyclic group.

5. The organic transistor of claim 1, wherein R1 and R2 are hydrogen.

6. The organic transistor of claim 1, wherein the compound of Formula 3 is a compound of any one of Formulae 1-12, 1-13, 1-15 and 1-16:

[Formula 1-12]
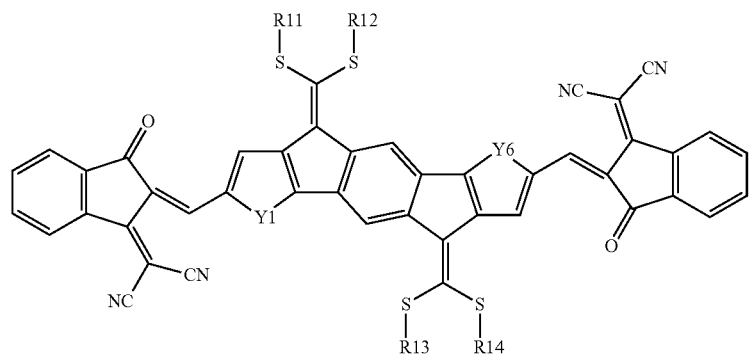
[Formula 1-13]
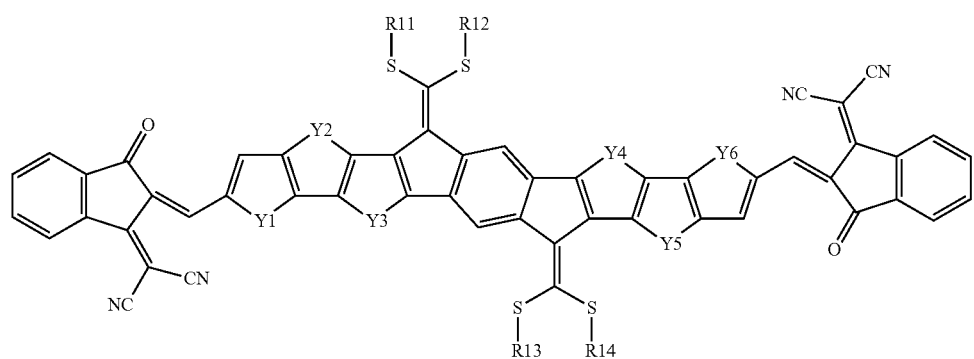
[Formula 1-15]
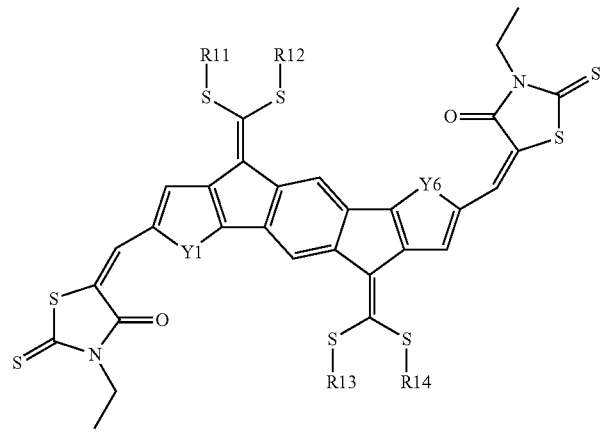
[Formula 1-16]
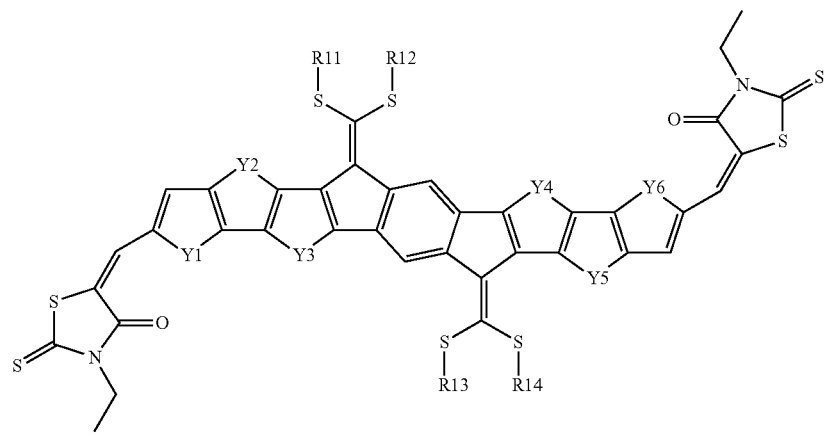

wherein:
Y6 is CRR', NR, O, SiRR', PR, S, GeRR', Se, or Te; and
Y1 to Y5, R11 to R14, R, and R' are the same as those defined in Formula 3.

7. The organic transistor of claim 1, wherein Y1 to Y5 are S.

8. The organic transistor of claim 1, wherein the compound of Formula 3 is a compound of Formula 1-2:

[Formula 1-2]

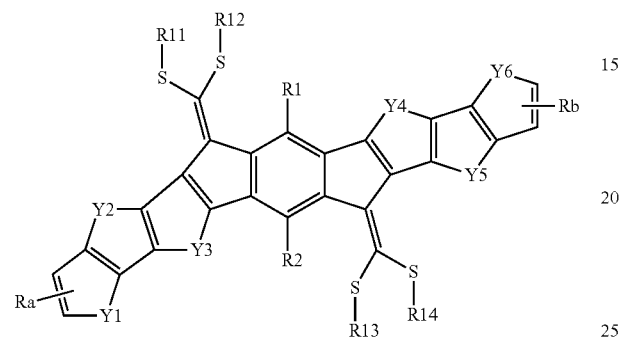

wherein:
Y6 is CRR', NR, O, SiRR', PR, S, GeRR', Se, or Te; and
Ra, Rb, Y1 to Y5, R1, R2, R11 to R14, R, and R' are the same as those defined in Formula 3.

* * * * *